United States Patent
Suzuki

(10) Patent No.: US 7,133,306 B2
(45) Date of Patent: Nov. 7, 2006

(54) SEMICONDUCTOR MEMORY DEVICE FOR SECURELY RETAINING DATA

(75) Inventor: Hideaki Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/079,314

(22) Filed: Mar. 15, 2005

(65) Prior Publication Data

US 2005/0180222 A1    Aug. 18, 2005

Related U.S. Application Data

(63) Continuation of application No. PCT/JP03/03317, filed on Mar. 19, 2003.

(51) Int. Cl.
   *G11C 11/22* (2006.01)
   *G11C 11/24* (2006.01)
(52) U.S. Cl. ............ 365/145; 365/149; 365/210; 365/222
(58) Field of Classification Search ............. None
   See application file for complete search history.

(56) References Cited

U.S. PATENT DOCUMENTS

| 5,615,145 A | 3/1997 | Takeuchi et al. |
| 5,694,353 A * | 12/1997 | Koike ............ 365/145 |
| 5,726,930 A | 3/1998 | Hasegawa et al. |
| 5,880,989 A * | 3/1999 | Wilson et al. ...... 365/145 |
| 5,969,979 A * | 10/1999 | Hirano ............ 365/145 |
| 6,501,674 B1 * | 12/2002 | Ashikaga .......... 365/145 |
| 6,853,576 B1 * | 2/2005 | Kato et al. ........ 365/145 |
| 2003/0031042 A1 | 2/2003 | Yamamoto et al. |
| 2004/0017704 A1 * | 1/2004 | Yamaoka et al. ...... 365/200 |

FOREIGN PATENT DOCUMENTS

| JP | 5-089692 | 4/1993 |
| JP | 8-171793 | 7/1996 |
| JP | 9-288893 | 11/1997 |
| JP | 2000-187989 | 7/2000 |

* cited by examiner

*Primary Examiner*—Son Mai
(74) *Attorney, Agent, or Firm*—Arent Fox PLLC

(57) ABSTRACT

To a bit line to which a memory cell having a ferroelectric capacitor is connected, a guarantee cell having a ferroelectric capacitor is connected. During a read operation of data from the memory cell, data is read out from the memory cell, and the data read out from the memory cell by destructive reading is written automatically to the guarantee cell, so that the data is retained securely as nonvolatile binary data regardless of operating condition, and thus loss of data can be suppressed.

25 Claims, 21 Drawing Sheets

F I G. 1
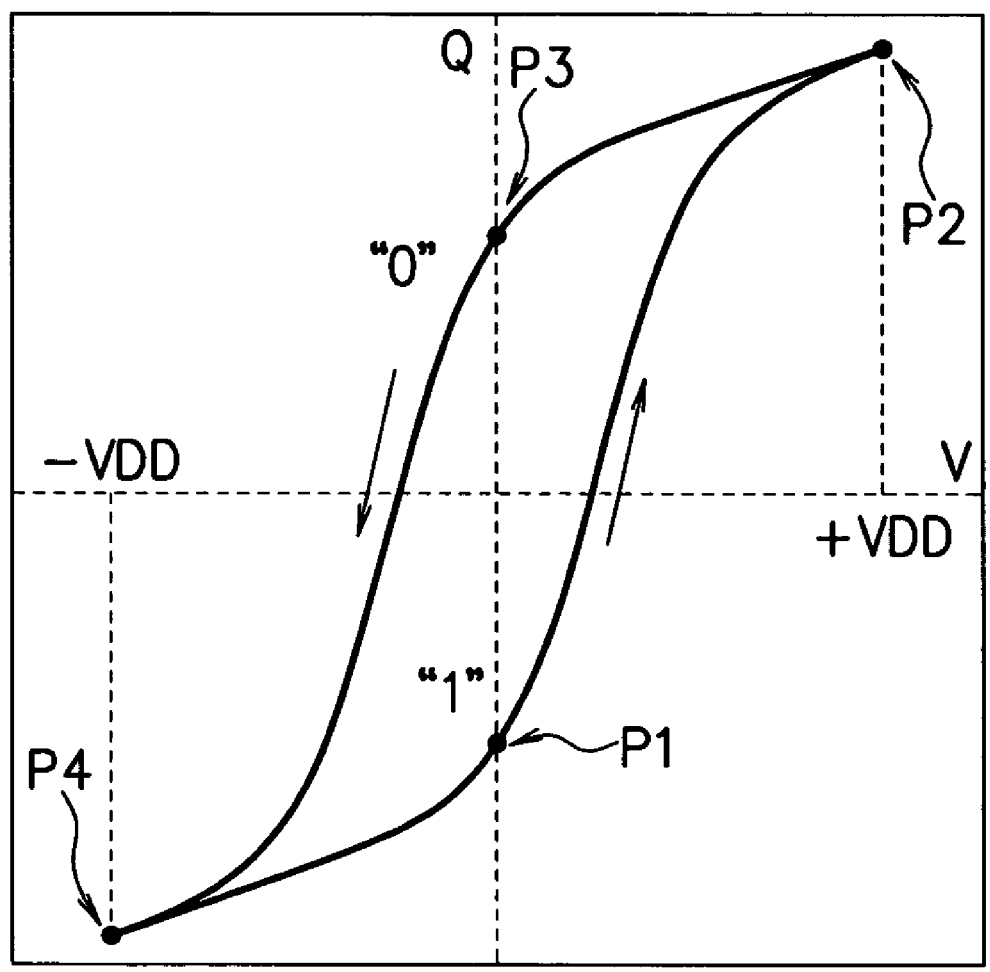

F I G. 7
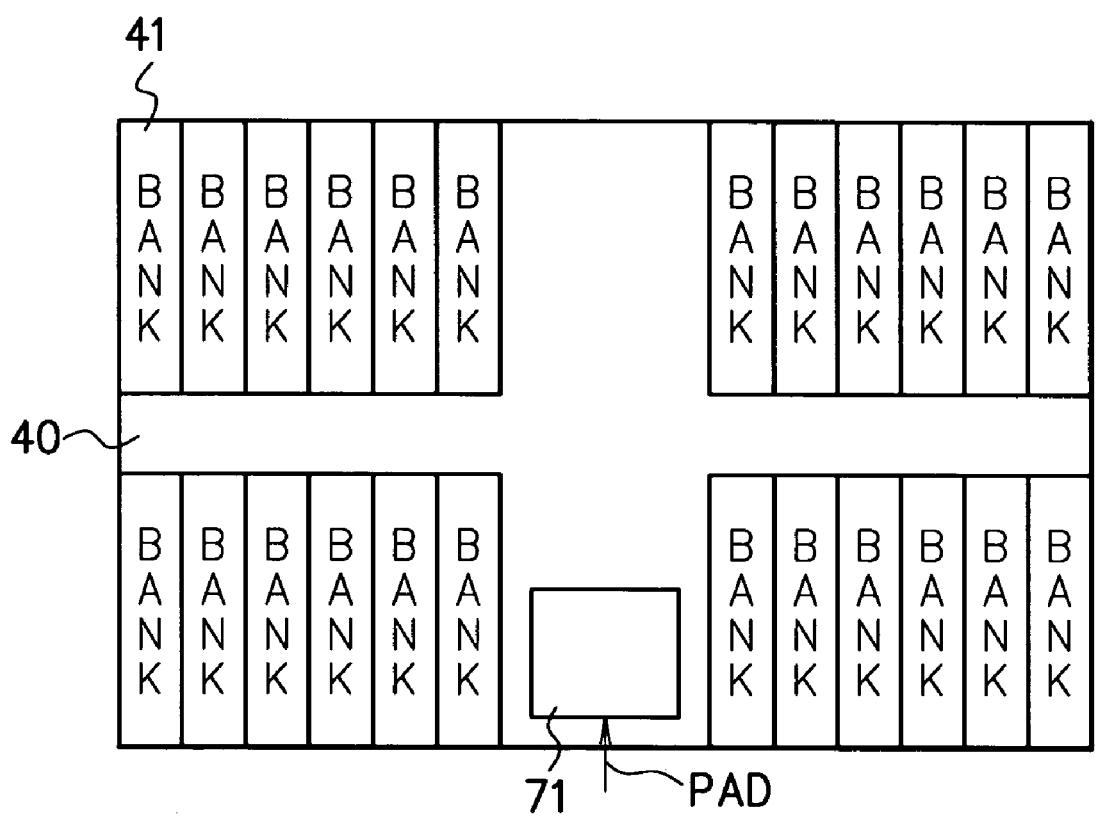

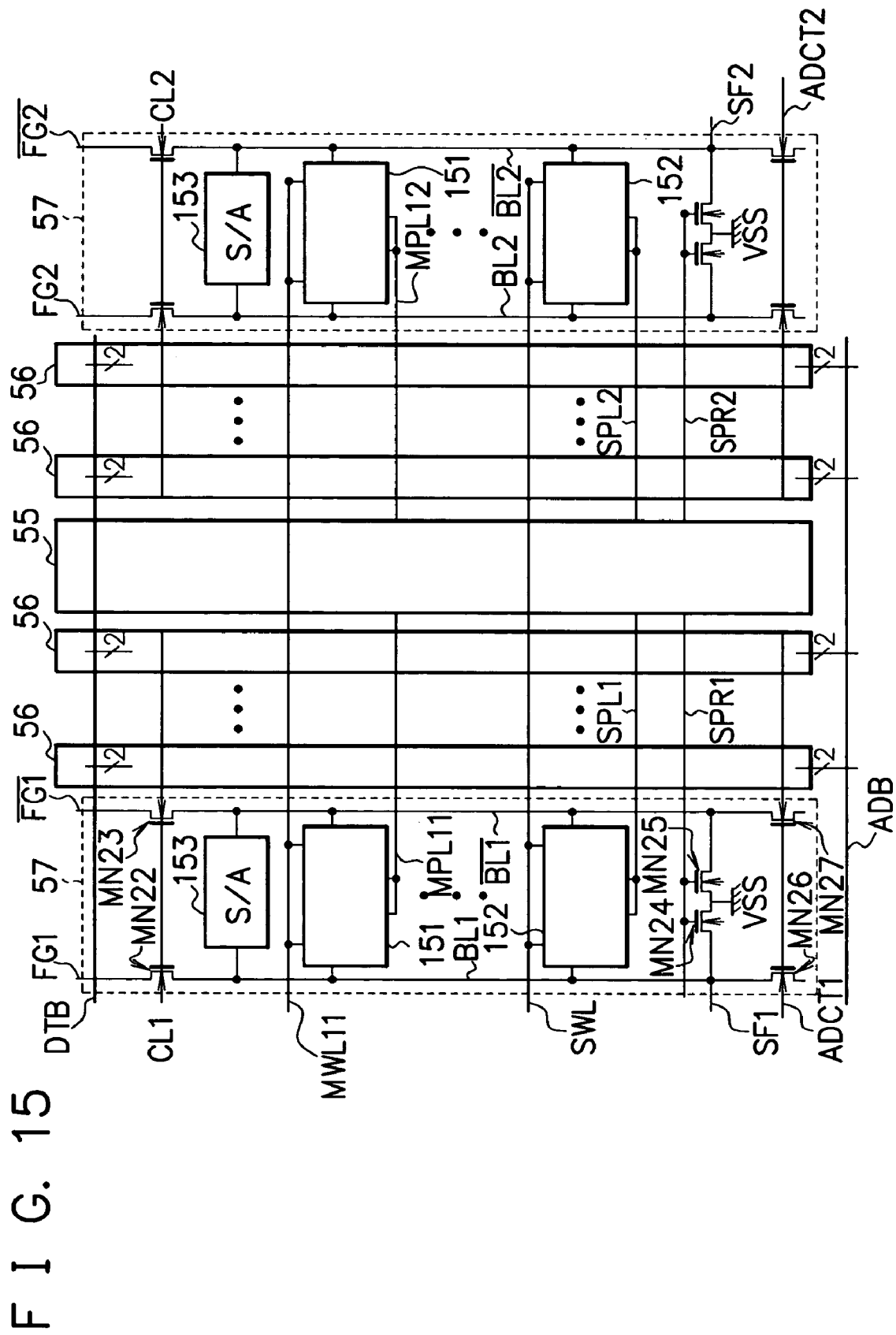
F I G. 15

F I G. 19
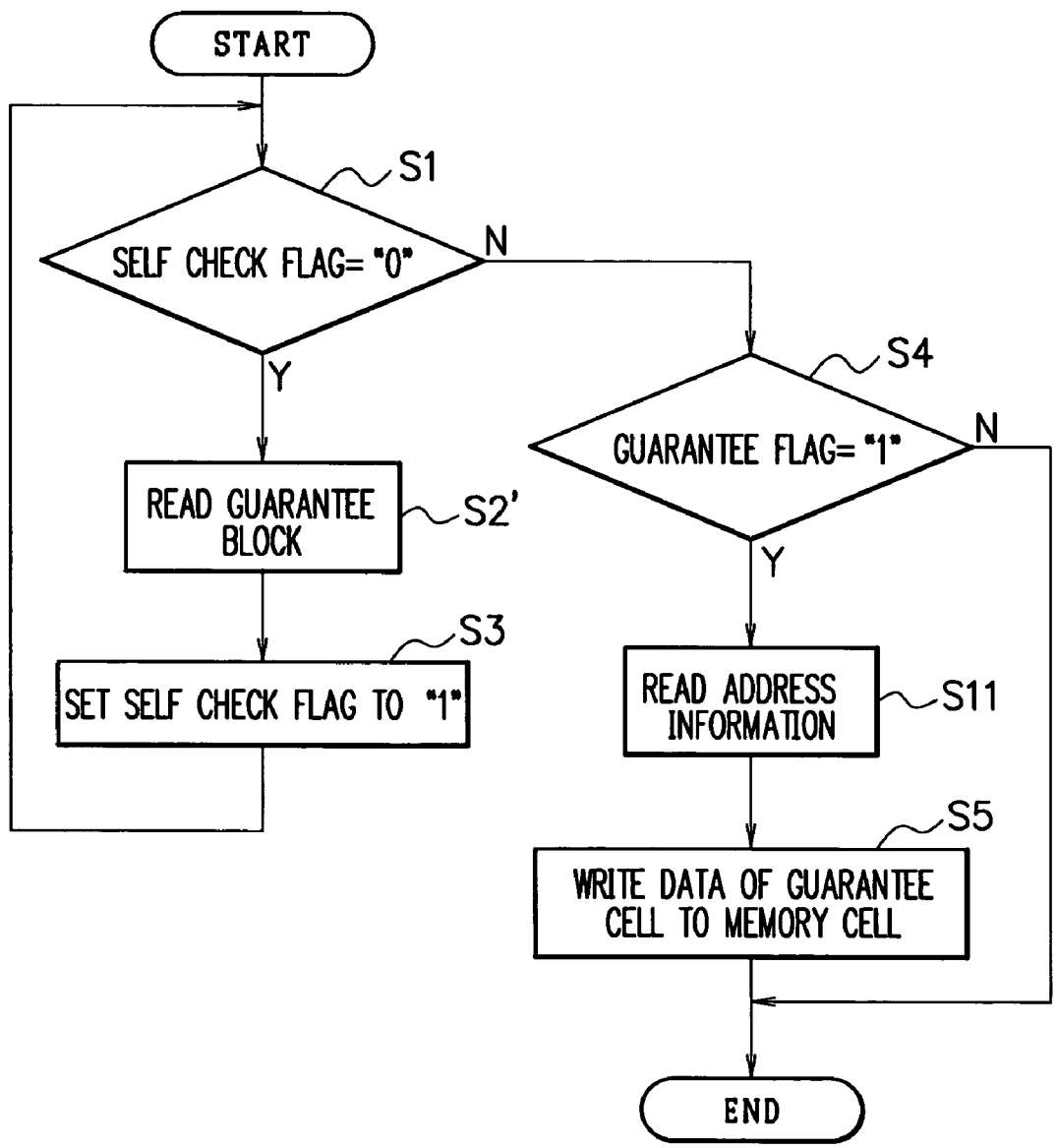

F I G. 24
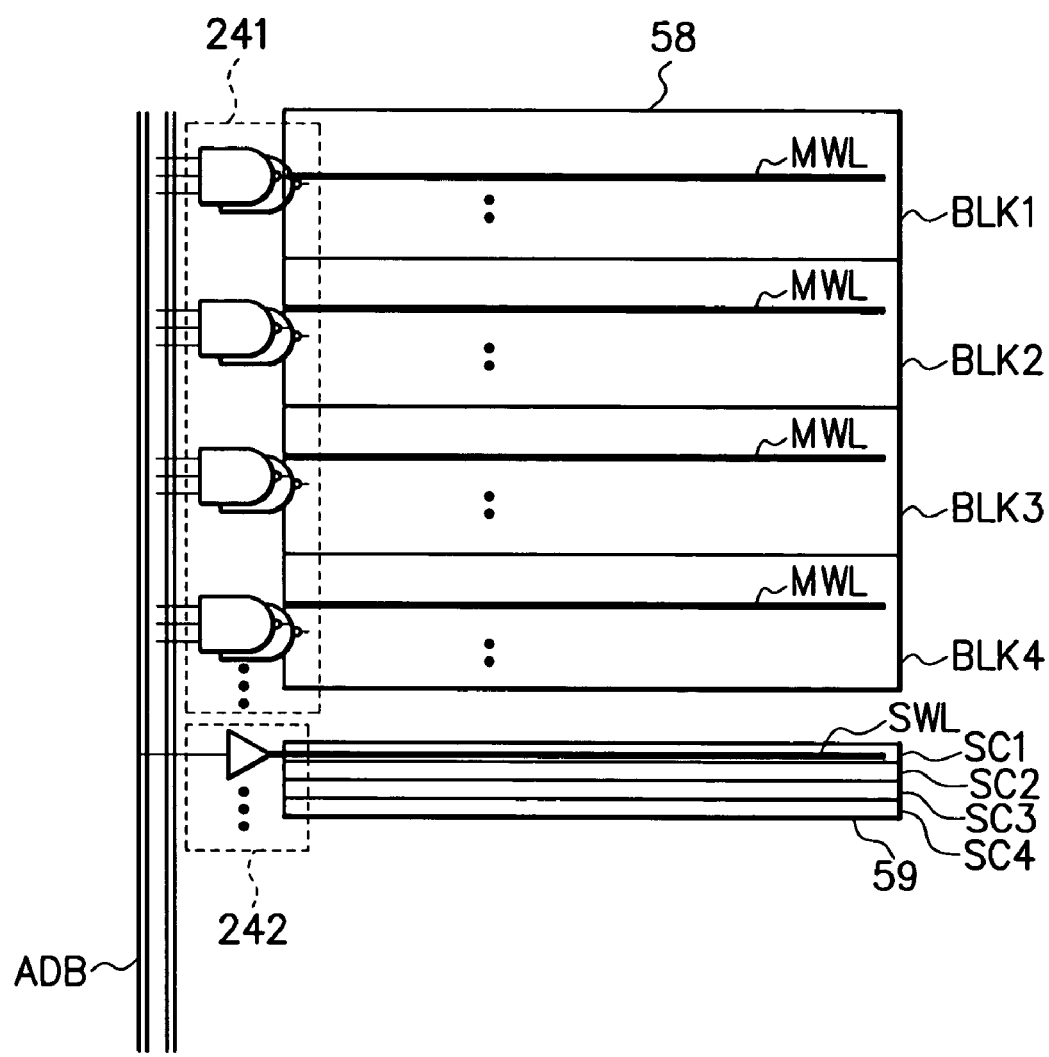

SEMICONDUCTOR MEMORY DEVICE FOR SECURELY RETAINING DATA

This nonprovisional application is a continuation application of and claims the benefit of International Application No. PCT/JP03/03317, filed Mar. 19, 2003. The disclosure of the prior application is hereby incorporated herein in its entirety by reference.

TECHNICAL FIELD

The present invention relates to a semiconductor memory device, and is particularly suitable for use in a ferroelectric memory using ferroelectric capacitors in memory cells.

BACKGROUND ART

A ferroelectric memory is a nonvolatile semiconductor memory having the same memory cell structure as a DRAM (Dynamic Random Access Memory) but using a ferroelectric capacitor (ferroelectric element) in a part corresponding to a dielectric capacitor in a memory cell of the DRAM. As a memory cell (storage unit of one bit data) of the ferroelectric memory, there are one transistor/one capacitor (1T/1C) type cell and two transistors/two capacitors (2T/2C) type cell, as disclosed in Japanese Patent Application Laid-open No. Hei 5-89692.

The ferroelectric memory stores binary data of "1", "0" by associating them with two different polarization states of the ferroelectric capacitor, and the memory cell exhibits nonvolatility when retaining data. However, reading out of data from the memory cell is destructive reading, which destroys and erases the retained data. Accordingly, in a reading sequence of data, a so-called restore operation (rewrite operation) is performed such that after a minute potential which appears on a bit line according to the retained data is amplified by a sense amplifier to obtain reading data as digital information, the data is written back to the memory cell.

Here, the conventional ferroelectric memory temporarily stores data read out from the memory cell by an electrical signal level (high level or low level) on the bit line until it performs the restore operation in the reading sequence of data, and thus it has instability in a retaining state of data. In other words, the conventional ferroelectric memory retains data read out from the memory cell by a volatile electric charge, and therefore it has possibility of losing data due to a power cut-off (including a cut-off of power supply, decrease of a power supply voltage), noise interference, swing of potential, and the like.

In the conventional ferroelectric memory, when the reading sequence of data is started, an externally inputted control signal and the like are controlled inside the memory device so that the sequence is not interfered from the outside until the restore operation is completed, in order to guarantee writing of data by the restore operation. Furthermore, in the conventional ferroelectric memory, a capacitor and so on for power supply for assuring stable power supply until the reading sequence is completed are provided internally, thereby causing enlargement of circuit area (chip area). According to the means as described above, data read out from the memory cell during the read sequence can be almost securely written (written back) to the memory cell, but it is not possible to confirm whether the reading sequence of data including the restore operation is completed properly or not.

Further, for the conventional ferroelectric memory, there has been a method using a so-called shadow RAM (a memory incorporating a pair of memory cells having the same data), and if data stored in a reading memory (one memory) is destroyed, the data is guaranteed by data stored in the other memory. However, since this method stores the same data in two areas, it needs a memory having storage capacity that is at least double of the amount of data, and its operation is complicated because data has to be synchronized constantly between the pair of memories.

Patent Document 1

Japanese Patent Application Laid-open No. Hei 5-89692

SUMMARY OF THE INVENTION

The present invention is made to solve such problems, and an object thereof is to securely retain data as nonvolatile binary data regardless of operating condition in a nonvolatile semiconductor memory device which has an operating condition involving destruction of data, thereby suppressing loss of data.

The semiconductor memory device according to the present invention has a memory cell provided at each intersection of pairs of plural word lines and plate lines adjacent thereto and plural bit lines, the memory cell having a ferroelectric capacitor, and a guarantee cell connected commonly with the memory cell to the bit lines, the guarantee cell having a ferroelectric capacitor. When data is read from the memory cell, the data read from the memory cell is written to the guarantee cell.

According to the present invention configured as above, when a minute potential of the bit line generated by the data read out from the memory cell is amplified by a sense amplifier, the read data can be simultaneously written to the guarantee cell automatically, so that the data to be destroyed by reading can be securely retained until a restore operation is completed.

BRIEF DESCRIPTION OF THE DRAWINGS

FIG. 1 is a diagram showing a hysteresis characteristic of a ferroelectric capacitor;

FIG. 7 is a block diagram showing another configuration example of the ferroelectric memory according to the first embodiment;

FIG. 15 is a diagram showing a concrete example of a bank of the ferroelectric memory according to the first embodiment;

FIG. 19 is a flowchart showing another example of the startup operation in the ferroelectric memory according to the first embodiment;

FIG. 24 is a diagram showing characteristic elements of a ferroelectric memory according to a third embodiment of the present invention.

DETAILED DESCRIPTION OF THE PREFERRED EMBODIMENTS

Hereinafter, an embodiment of the present invention will be described based on the drawings.

First, principles of a ferroelectric memory will be described.

FIG. 1 is a diagram showing a hysteresis characteristic of a ferroelectric capacitor. A horizontal axis represents an applied voltage to be applied to the ferroelectric capacitor, and a vertical axis represents a polarization charge amount.

In FIG. 1, as the applied voltage changes from 0 V→+VDD (a power supply voltage)→0 V→−VDD→0 V, the polarization charge changes from points P1→P2→P3→P4→P1. As shown in FIG. 1, on a hysteresis curve, there are two stable points P1, P3 each having a different polarization direction and having a polarization charge at the 0 V applied voltage. By associating digital data of "1", "0" with these points P1, P3, a memory element in which the ferroelectric capacitor retains data is configured.

Further, the points P1, P3 show that the ferroelectric capacitor maintains the polarization state when the voltage is not applied, and thus the ferroelectric capacitor exhibits nonvolatility of data as a memory element. Incidentally, in the ferroelectric capacitor, the polarization direction is associated with retained data, and the polarization direction inversely changes when data of "1", "0" are replaced, which is called an "inversion of polarization".

Figure 2A:
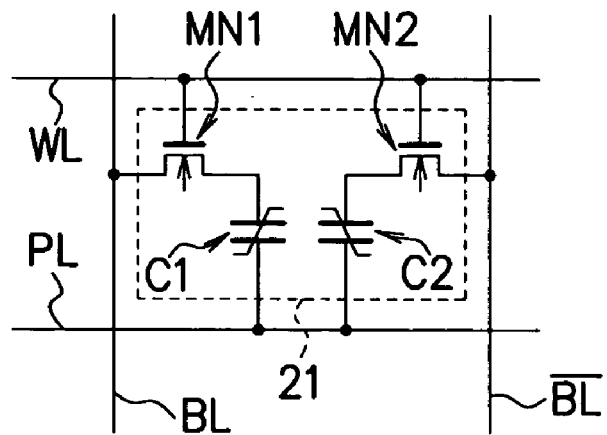
FIG. 2A and FIG. 2B are diagrams showing configuration examples of a memory cell of a ferroelectric memory.

FIG. 2A is a diagram showing a configuration example of a memory cell (2T/2C type cell) of the ferroelectric memory. A memory cell 21 is constituted of two N-channel MOS transistors (transfer gates) MN1, MN2 and two ferroelectric capacitors C1, C2, and retains one data in a relationship of complementary data by the ferroelectric capacitors C1, C2.

One electrode of the ferroelectric capacitor C1 is connected to a bit line BL via the transistor MN1 whose gate is connected to a word line WL, and the other electrode is connected to a plate line PL. Similarly, one electrode of the ferroelectric capacitor C2 is connected to a bit line /BL (the bit lines BL and /BL are in a complementary relationship) via the transistor MN2 whose gate is connected to the word line WL, and the other electrode is connected to the plate line PL.

Figure 2B:
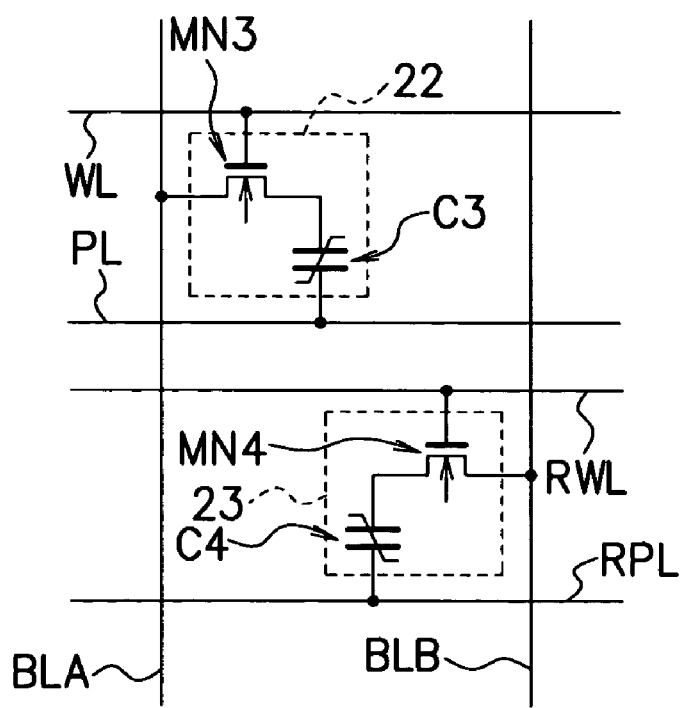

FIG. 2B is a diagram showing a configuration example of a memory cell (1T/1C type cell) of the ferroelectric memory. A memory cell 22 and a reference cell 23 for outputting a reference potential are constituted of N-channel MOS transistors (transfer gates) MN3, MN4, and ferroelectric capacitors C3, C4, respectively.

One electrode of the ferroelectric capacitor C3 is connected to a bit line BLA via the transistor MN3 whose gate is connected to a word line WL, and the other electrode is connected to a plate line PL. Further, one electrode of the ferroelectric capacitor C4 is connected to a bit line BLB via the transistor MN4 whose gate is connected to a reference word line RWL, and the other electrode is connected to a reference plate line RPL.

As described above, the ferroelectric memory has the same memory cell structure as a DRAM, which can be highly integrated similarly to the DRAM.

Here, the DRAM retains data by storing an electric charge in a dielectric capacitor. In the DRAM, when a transfer gate is opened (turned to an ON state), a minute potential corresponding to data is generated on a bit line by the electric charge discharged from the dielectric capacitor, and this minute potential is amplified by a sense amplifier to retrieve data "1", "0".

On the other hand, the ferroelectric memory, being different from the DRAM, retains data not in the form of electric charge but in the form of polarization in the ferroelectric capacitor. Therefore, in the ferroelectric memory, data retained in the ferroelectric capacitor cannot be retrieved by just opening a transfer gate.

In the ferroelectric capacitor, change in the polarization charge amount generates an electric charge corresponding to the difference in the polarization charge amount before and after the change. Therefore, to read out data from the memory cell, it is necessary to apply a voltage to the ferroelectric capacitor so that it makes movement along the hysteresis curve (change the polarization charge amount). Then, when reading out data in the ferroelectric memory, a positive voltage is applied to the electrode on the plate line side of the ferroelectric capacitor.

Figure 3:
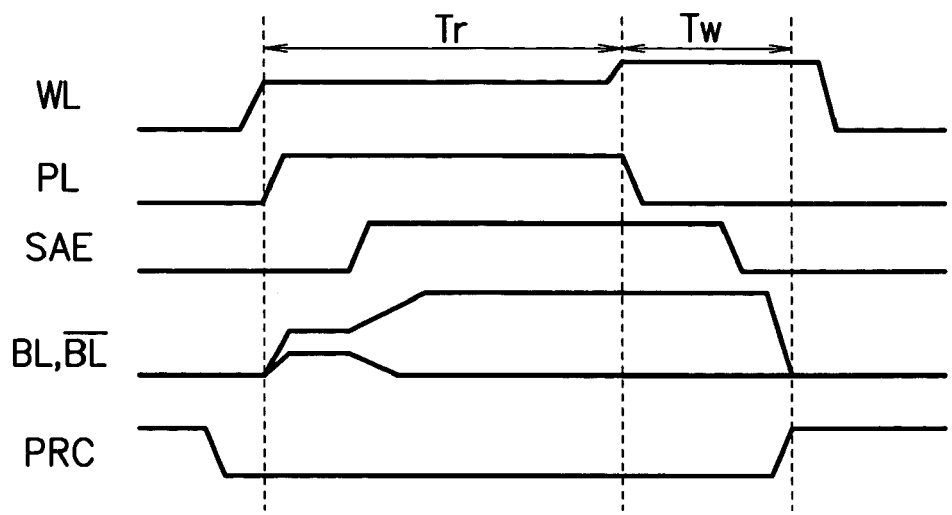
FIG. 3 is a timing chart showing a reading sequence of data in the ferroelectric memory.

FIG. 3 is a timing chart showing a reading sequence of data in the ferroelectric memory, and showing the case of the ferroelectric memory having the memory cell constituted of the 2T/2C type cell as an example. The description below will be given with appropriate reference to FIG. 2A.

After a potential of a precharge signal line PRC is set to a low level (for example, a ground level (ground potential), hereinafter referred to as "L") to turn the bit lines BL, /BL to a floating state, a potential of the word line WL is turned to a high level (for example, a voltage +VDD, hereinafter referred to as "H") to open (turn to an ON state) the transfer gates MN1, MN2. Furthermore, when a potential of the plate line PL is turned to "H" to apply a voltage to the ferroelectric capacitors C1, C2, electric charges with amounts corresponding to data retained in the memory cell (ferroelectric capacitors) are supplied from the ferroelectric capacitors C1, C2 to the bit lines BL, /BL respectively, thereby generating minute potentials on the bit lines BL, /BL.

Subsequently, a potential of a sense amplifier signal line SAE is set to "H" to activate the sense amplifier to amplify a minute potential difference between the bit lines BL, /BL, and thus data "1" or data "0" is read out. Data is read out from the memory cell as described above, and during a period Tr, the polarization direction of the ferroelectric capacitor retaining the data "0" is not changed, but the polarization of the ferroelectric capacitor retaining the data "1" is inverted.

Accordingly, in a state that the potentials of the bit lines BL, /BL are retained, the potential of the plate line PL is turned to "L". Thus, to the ferroelectric capacitors C1, C2 retaining the data "1", a voltage (corresponding to −VDD in FIG. 1) is applied in a direction from the bit lines BL, /BL side to the plate line PL side, which is a reverse direction to that for reading, and their polarizations are inverted as shown in FIG. 1 (transferred to the area of the data "1"). During a period Tw, writing of the data "1" to the memory cell (restore operation) is thus performed.

Then, the potentials of the signal lines SAE, PRC are turned respectively to "L", "H", and further the potential of the word line WL is turned to "L" to close (turn to an OFF state) the transfer gates MN1, MN2, thereby completing the reading sequence.

First Embodiment

A semiconductor memory device according to a first embodiment of the present invention suppresses loss of data even when a reading sequence finishes abnormally before a restore operation due to unexpected occurrence of an accident such as a power cut-off. For that purpose, inside the device during a normal state, as soon as data is read out to a bit line from a memory cell retaining the data, the read data is written to and retained in a guarantee cell for retaining data temporarily. Further, address information (address data) is retained as location information for specifying the memory cell from which the data is read out. In case that the reading sequence abnormally finishes before the restore operation, the data retained in the guarantee cell can be written to the memory cell during a startup operation based on the address information.

Figure 4:
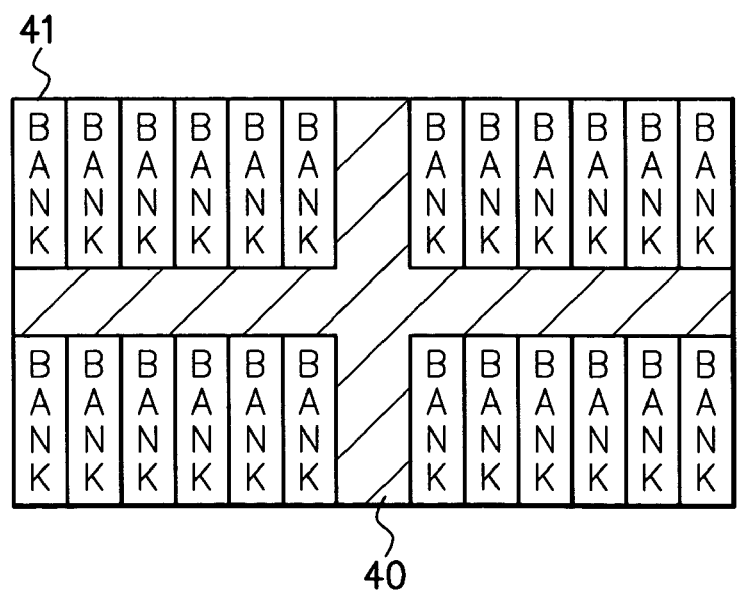
FIG. 4 is a block diagram showing a configuration example of a ferroelectric memory applying a semiconductor memory device according to a first embodiment of the present invention.

FIG. 4 is a block diagram showing a configuration example of a ferroelectric memory device applying the semiconductor memory device according to the first embodiment of the present invention. The ferroelectric memory in the first embodiment has a peripheral circuit 40 and a plurality of banks 41 as shown in FIG. 4. The peripheral circuit 40 includes an address buffer for outputting externally inputted address information to an internal address bus, an input/output buffer for inputting and outputting data via a data bus, respective control circuits, and so on.

Figure 5:
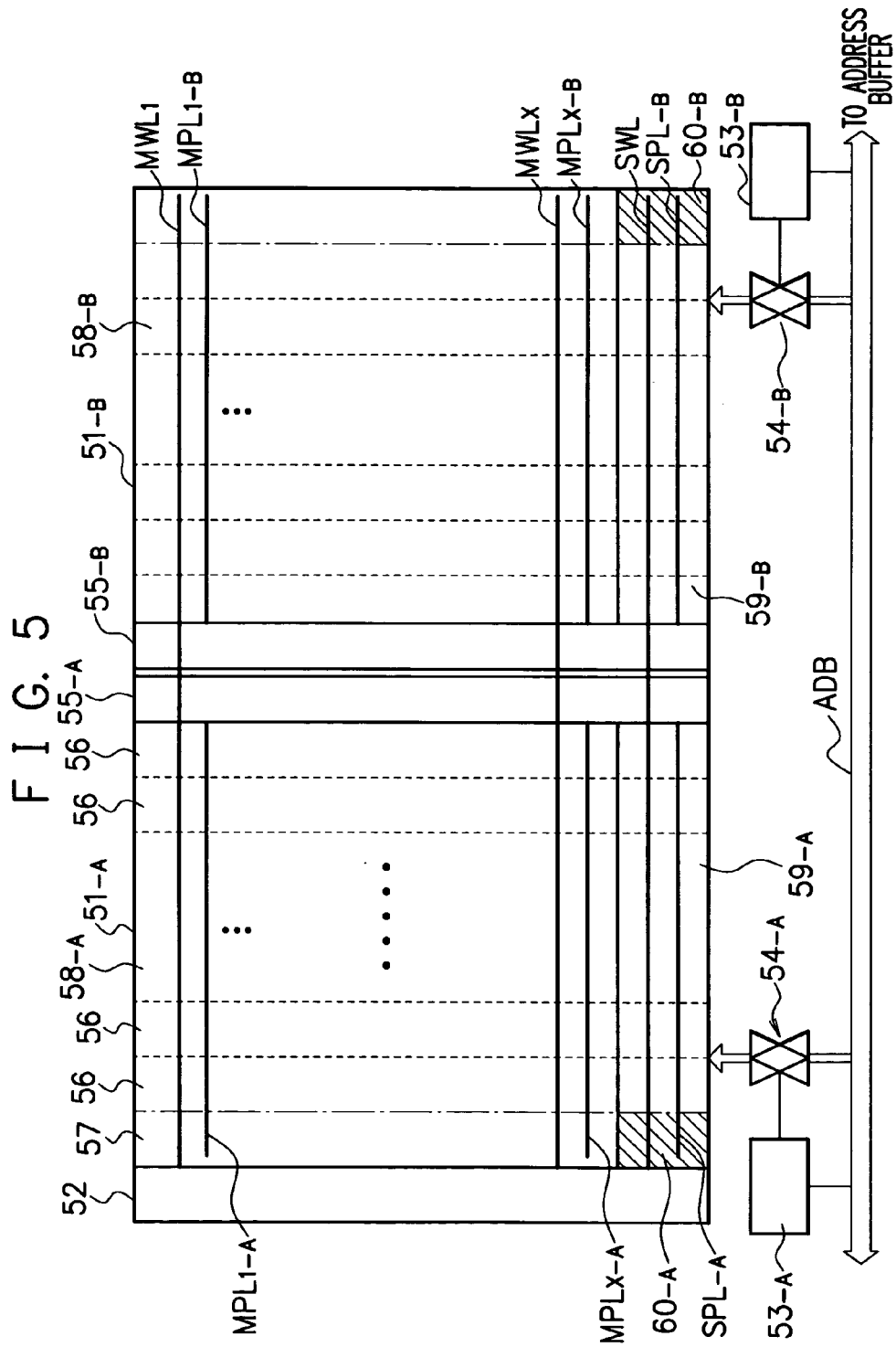
FIG. 5 is a block diagram showing a configuration example of a bank of the ferroelectric memory according to the first embodiment.

FIG. 5 is a block diagram showing a configuration example of the bank 41 shown in FIG. 4. The bank 41 is constituted of two blocks $51_{\_A}$, $51_{\_B}$, a word line drive circuit 52, control circuits $53_{\_A}$, $53_{\_B}$ and switches $54_{\_A}$, $54_{\_B}$ provided corresponding to the blocks $51_{\_A}$, $51_{\_B}$ respectively. The word line drive circuit 52 selectively activates word lines MWLj, SWL according to a decode result of the address information or the like. The control circuits $53_{\_A}$, $53_{\_B}$ perform control of the switches $54_{\_A}$, $54_{\_B}$ provided respectively between an address bus ADB and the blocks $51_{\_A}$, $51_{\_B}$ and the like according to address information inputted via the address bus ADB.

The block $51_{\_A}$ has a plate line drive circuit $55_{\_A}$ which selectively activates plate lines $MPLj_{\_A}$ according to a decode result of the address information or the like, a plurality of column units 56 for retaining data, and a column unit 57 for retaining a guarantee flag. The column units 56, 57 each have, although not being shown in FIG. 5, two bit lines provided in an orthogonal direction to the word lines MWLj, SWL and plate lines $MPLj_{\_A}$, $SPL_{\_A}$.

In the column unit 56, a memory cell is provided at each intersection of the word lines MWLj and the plate lines $MPLj_{\_A}$ and the bit lines, and a guarantee cell is provided at each intersection of the word line SWL and the plate line $SPL_{\_A}$ and the bit lines.

Further, in the column unit 57, a guarantee flag cell which stores a guarantee flag is provided at an intersection of the word line SWL and the plate line $SPL_{\_A}$ and the bit lines. Here, the guarantee flag indicates whether a sequence such as a reading sequence, writing sequence, or the like is completed normally or not, in other words, whether an operation of the guarantee cell is completed or not. The guarantee flag cell is configured similarly to the guarantee cell, but is provided as one system independently from the guarantee cells used for guaranteeing data by providing the column unit 57 as shown in FIG. 5. A group of the memory cells in the block constitutes a memory cell block $58_{\_A}$. Similarly, a group of the guarantee cells constitutes a guarantee block $59_{\_A}$, and the guarantee block $59_{\_A}$ in the column unit 57 is referred to as a guarantee flag cell unit $60_{\_A}$.

Incidentally, in the word lines MWLj and the plate lines $MPLj_{\_A}$, j is a suffix indicating a natural number that is j=1 to x (x is arbitrary). The block $51_{\_B}$ has the same configuration as the block $51_{\_A}$, so the description thereof is omitted. The word lines MWLj, SWL are provided in each bank 41, and the plate lines $MPLj_{\_A}$, $SPL_{\_A}$, $MPLj_{\_B}$, $SPL_{\_B}$ are provided in each of the blocks $51_{\_A}$, $51_{\_B}$.

In the block $51_{\_A}$, $51_{\_B}$, the plate lines $MPLj_{\_A}$, $MPLj_{\_B}$ of both the blocks will not be activated at the same time. When a plate line in one block is selectively activated, all the plate lines in the other block are in an inactive state. Hereinafter, the block in which the plate lines are activated will be referred to as "active block", and the block in which all the plate lines retain the inactive state will be referred to as "sleep block".

When the address information is retained in the guarantee cell, the address information is written to and retained in a guarantee cell on the sleep block side of an active bank in which the word lines MWLj are selectively activated. Specifically, when there is access from the outside to the memory device (ferroelectric memory), inputted address information is latched in the address buffer and at the same time supplied to each bank 41 via the address bus ADB. When bank selection information is included in the address information supplied to each bank 41, the bank selection information is erased because it is unnecessary information. The same process is performed in an address decoder unit included in each bank 41, so that a result thereof may be used.

The address information in the row direction (selection information by which the word lines MWLj can be specified) obtained as above is written and retained in the guarantee cell on the sleep block side, which is selected by the address decode unit. Thus, the address information can be retained in the guarantee cell having nonvolatility, thereby enabling prevention of loss of the address information in a case of unexpected occurrence of a power cut-off. Writing of the address information to the guarantee cell is performed such that a potential of the word line SWL is turned to "H" in advance, and a potential in accordance with the obtained address information is supplied to the bit line connected to the guarantee cell. Further, the guarantee cell in which the address information is written is initialized by turning a potential of the bit line to "L" to thereby change a potential of the plate line SPL to the power supply voltage VDD.

Figure 6:
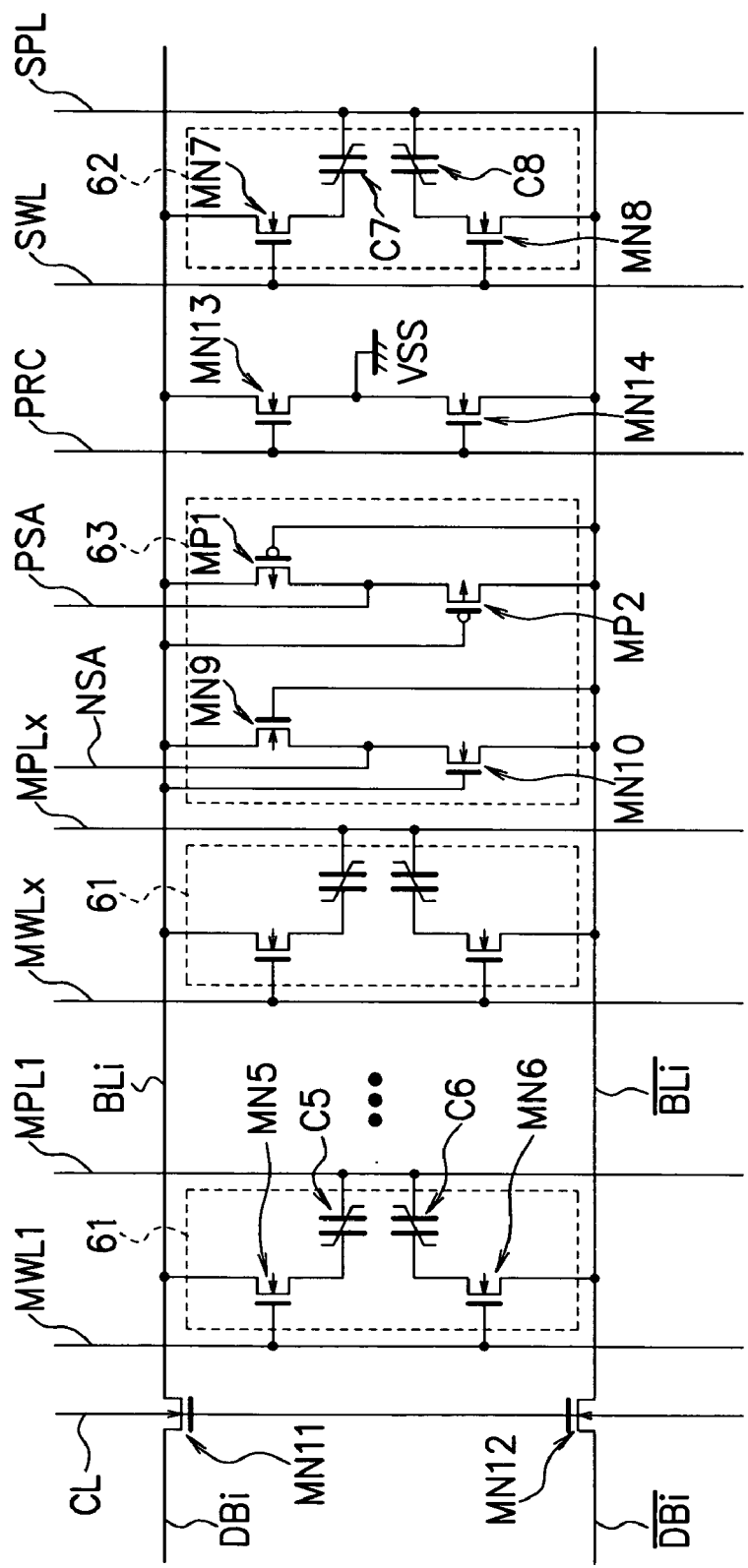
FIG. 6 is a circuit diagram showing an example of a column unit of the ferroelectric memory according to the first embodiment.

FIG. 6 is a circuit diagram showing an example of the column unit 56, and showing as an example a column unit in which memory cells and a guarantee cell are constituted of the 2T/2C type cells.

In FIG. 6, BLi, /BLi are bit lines, MWLj, SWL are word lines, MPLj, SPL are plate lines, PRC is a precharge signal line, CL is a column signal line, DBi, /DBi are data signal lines connected to a data bus, PSA, NSA are control signal lines.

The column unit 56 has a plurality of memory cells 61 controlled by the word lines MWLj and the plate lines MPLj, and a guarantee cell 62 controlled by the word line SWL and the plate line SPL, and the memory cells 61 and the guarantee cell 62 are connected in the same manner to the bit lines BLi, /BLi. Further, the column unit 56 has a sense amplifier 63 for amplifying a potential difference between the bit lines BLi, /BLi.

Since the memory cells 61 have the same configuration except that they are connected to the different word lines MWLj and plate lines MPLj, the configuration will be described with reference to the memory cell 61 which is connected to a word line MWL1 and a plate line MPL1.

The memory cell 61 is constituted of two N-channel MOS transistors (transfer gates) MN5, MN6, and two ferroelectric capacitors C5, C6. One electrode of the ferroelectric capacitor C5 is connected to the bit line BLi via the transistor MN5 whose gate is connected to the word line MWL1, and the other electrode is connected to the plate line MPL1. One electrode of the ferroelectric capacitor C6 is connected to the bit line /BLi via the transistor MN6 whose gate is connected to the word line MWL1, and the other electrode is connected to the plate line MPL1.

The guarantee cell 62 is configured similarly to the memory cell 61 and constituted of two N-channel MOS transistors (transfer gates) MN7, MN8 and two ferroelectric capacitors C7, C8. One electrodes of the ferroelectric capacitors C7, C8 are connected to the bit lines BLi, /BLi via the transistors MN7, MN8 whose gates are connected to the word line SWL, and the other electrodes are connected to the plate line SPL.

The sense amplifier 63 is constituted of two P-channel MOS transistors (pull-up transistors) MP1, MP2, to which a drive voltage is supplied via the control signal line PSA, and two N-channel MOS transistors (pull-down transistors) MN9, MN10 to which the drive voltage is supplied via the control signal line NSA.

MN11, MN12 are N-channel MOS transistors (column gates). Gates of the transistors MN11, MN12 are connected to the column signal line CL, drains thereof are connected to the bit lines BLi, /BLi respectively, and sources thereof are connected to the data signal lines DBi, /DBi respectively. MN13, MN14 are N-channel MOS transistors. Gates of the transistors MN13, MN14 are connected to the precharge signal line PRC, drains thereof are connected to the bit lines BLi, /BLi respectively, and sources thereof are connected to a node to which a reference potential VSS (for example, the ground level (GND)) is supplied. Incidentally, in the following description, the reference potential VSS is the ground level, and for the convenience of explanation, "connection to the node to which the reference potential VSS is supplied" is referred to as "connection to the ground".

Incidentally, in FIG. 6, in order to configure the guarantee cell 62 with the 2T/2C type cell similar to the memory cell 61, the word line SWL which controls the guarantee cell 62 is provided. However, when each column unit 56 has only one guarantee cell 62, the guarantee cell 62 may be configured only with the two ferroelectric capacitors C7, C8 without providing the word line SWL. In this case, one electrodes of the ferroelectric capacitors C7, C8 are connected to the bit lines BLi, /BLi respectively, and the other electrodes are connected to the plate line SPL.

Similarly, when each column unit 56 has only one guarantee cell 62, the gates of the transistors MN7, MN8 may be connected to the power supply voltage VDD with the guarantee cell 62 being configured as shown in FIG. 6.

Further, in the column unit 57, signal lines to which the bit lines BLi, /BLi are connected via the transistors MN11, MN12 are not the data signal lines DBi, /DBi but guarantee flag signal lines for setting the guarantee flag, and the rest of which has the same configuration as the column unit 56, so that the description thereof is omitted.

In the above description, the address information is retained in the guarantee cell. In this method, the loss of the address information can be prevented, but it is conceivable that the circuit configuration becomes complicated or the time needed for processing of access becomes long (an access cycle becomes slow) since the address information should be written to the guarantee cell before access to the memory cell is carried out. Accordingly, as shown in FIG. 7, it may be configured such that a nonvolatile ferroelectric latch circuit is provided in an address buffer unit 71 to which address information PAD is inputted externally, and the address information is retained in the address buffer unit 71 not by the guarantee cell but by the ferroelectric latch circuit and is supplied to a bank (block) as necessary.

Using this method, an overhead (load) for accessing the memory cell can be suppressed as much as possible, and since it is not necessary to write the address information in the guarantee cell, charge/discharge of the bit lines related to writing of the address information are not performed, which allows more reduction in power consumption than the method of writing the address information in the guarantee cell. Incidentally, in this FIG. 7, blocks having the same function as the blocks shown in FIG. 4 are designated the same reference numerals.

Figure 8:
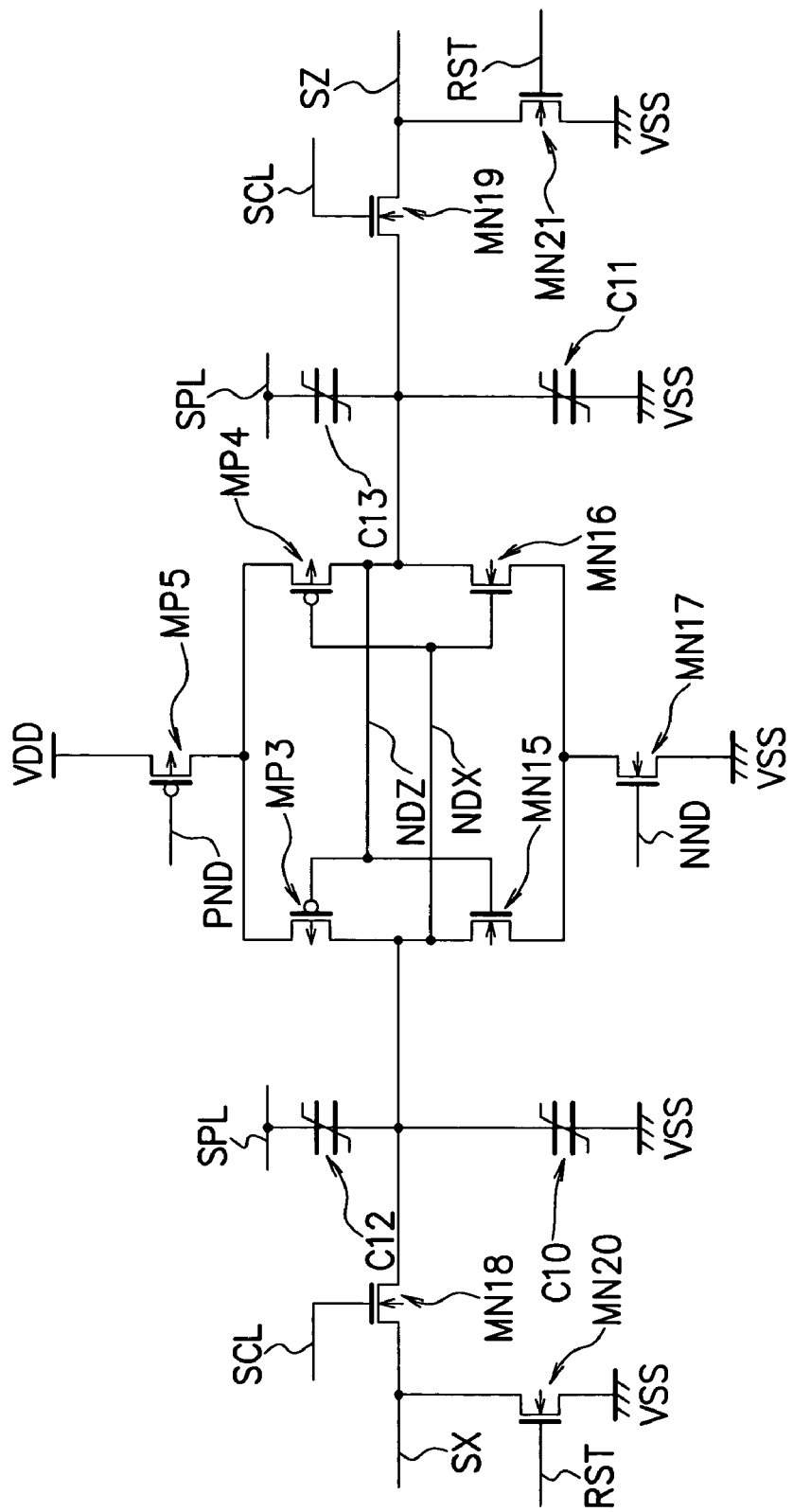
FIG. 8 is a circuit diagram showing an example of a ferroelectric latch circuit included in an address buffer.

FIG. 8 is a circuit diagram showing a configuration example of the ferroelectric latch circuit provided in the address buffer unit 71. In FIG. 8, MP3 to MP5 and MN15 to MN21 are P-channel MOS transistors and N-channel MOS transistors respectively, and C10 to C13 are ferroelectric capacitors.

The transistors MP3 and MN15 and the transistors MP4 and MN16 constitute inverters respectively, and these two inverters are cross-coupled to constitute an SRAM (Static Random Access Memory) cell. To the SRAM cell, power is supplied via the transistors MP5, MN17 whose gates are connected to signal lines PND, NND, respectively.

One input/output node of the SRAM cell is connected to a signal line SX via the transistor MN18 whose gate is connected to a signal line SCL, and the other input/output node is connected to a signal line SZ via the transistor MN19 whose gate is connected to the signal line SCL. Further, the signal lines SX, SZ are connected to the ground via the transistors MN20, MN21 whose gates are connected to a reset signal line RST. Incidentally, the signal lines SX, SZ are signal lines in a complementary relationship.

One electrodes of the ferroelectric capacitors C10, C12 are connected commonly to the one input/output node of the SRAM cell, and one electrodes of the ferroelectric capacitors C11, C13 are connected commonly to the other input/output node of the SRAM cell. Further, the other electrodes of the ferroelectric capacitors C10, C11 are connected to the ground, and the other electrodes of the ferroelectric capacitors C12, C13 are connected to the signal line SPL.

To the ferroelectric latch circuit shown in FIG. 8, an output of a latch circuit of a not-shown address buffer which latches inputted address information is inputted. Further, the ferroelectric latch circuit is needed to be initialized once before usage in order to set the ferroelectric capacitors C10, C11 to be load capacitors to a predetermined state.

Initialization in the ferroelectric latch circuit is performed such that, in a state that the power supply to the SRAM cell is cut off, the power supply voltage VDD is applied to the input/output nodes of the SRAM cell by the signal lines SX, SZ and the like, and thereafter they are discharged to the ground level. Thus, the state of the ferroelectric capacitors C10, C11 transit on a linear term (linear region, which is the region between the point P1 and the point P4 shown in FIG. 1 (not including the other points)) which is not accompanied by a switching operation (inversion of polarization).

Next, the operation of the ferroelectric latch circuit shown in FIG. 8 will be described.

Figure 9:
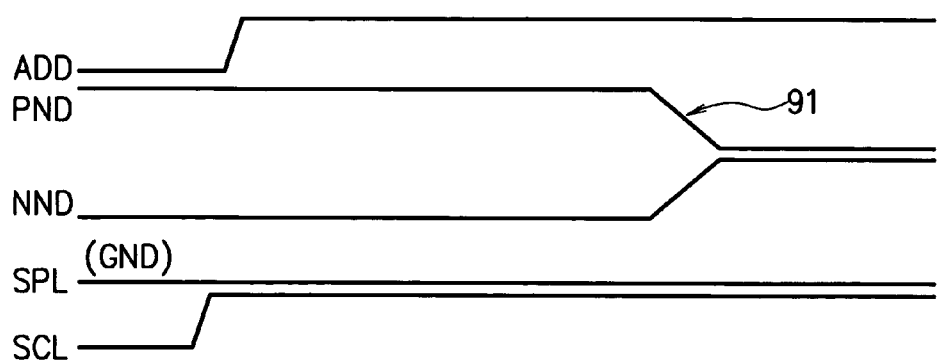
FIG. 9 is a timing chart showing a write operation in the ferroelectric latch circuit shown in FIG. 8.

FIG. 9 is a timing chart showing a write operation in the ferroelectric latch circuit shown in FIG. 8.

When writing address information to the ferroelectric latch circuit, first, potentials of the signal lines PND, NND are turned to "H", "L" respectively so that the power supply to the SRAM cell is cut off. Since the SRAM cell itself is a latch circuit and latch data may be inverted when power is supplied to the SRAM cell, this is done for preventing wasting of power originated in inversion of the latch data.

When a potential of the signal line SCL becomes "H", the transistors MN18, MN19 are turned to an ON state. Accordingly, signals inputted by the signal lines SX, SZ are transmitted to the input/output nodes of the SRAM cell via the transistors MN18, MN19, thereby changing a potential ADD of the input/output nodes. Subsequently, the potentials of the signal lines PND, NND change respectively to "L", "H" to supply power to the SRAM cell (at time 91 in FIG. 9), which makes the potential ADD of the input/output nodes of the SRAM cell adequately reach the power supply voltage or the ground level, thereby writing the address information to the ferroelectric capacitors C12, C13.

Incidentally, when P-channel MOS transistors are used instead of the transistors MN18, MN19 respectively, or when the voltage to be applied to the ferroelectric capacitors C12, C13 are satisfied by a voltage decreased by the threshold of the N-channel MOS transistor, it may be unnecessary to supply power to the SRAM cell when writing the address information.

Figure 10:
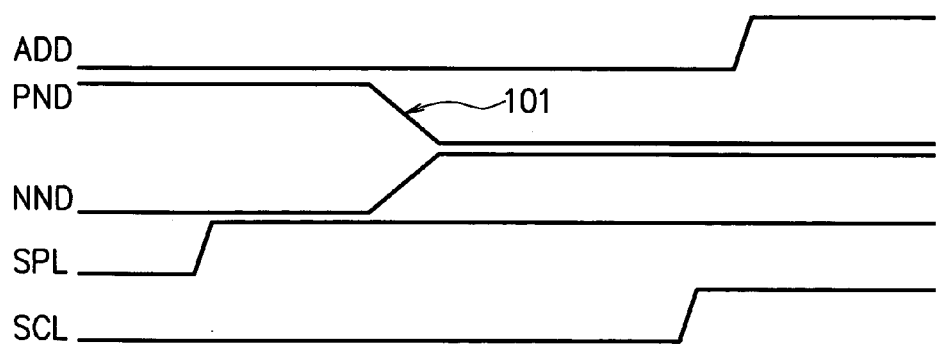
FIG. 10 is a timing chart showing a read operation in the ferroelectric latch circuit shown in FIG. 8.

FIG. 10 is a timing chart showing a read operation in the ferroelectric latch circuit shown in FIG. 8.

First, when a potential of the signal line SPL is turned to "H" to perform reading from the ferroelectric capacitors C12, C13 with the ferroelectric capacitors C10, C11 being the load capacitors, potentials corresponding to data retained in the ferroelectric capacitors C12, C13 (address information) are generated respectively at the input/output nodes of the SRAM cell. Regarding the potentials generated respectively at the input/output nodes of the SRAM cell, one side becomes equivalent to the data "1", and the other side to the data "0", since the SRAM cell is a complementary cell.

Subsequently, the potentials of the signal lines PND, NND change respectively to "L", "H" to supply power to the SRAM cell (at time T101 in FIG. 10), which makes the SRAM cell to act as a sense amplifier to amplify the potential of the input/output nodes of the SRAM cell. Accordingly, the potentials of the input/output nodes of the SRAM cell become the power supply voltage or the ground level. By change of the potential of the signal line SCL to "H", the potentials of the input/output nodes of the SRAM cell are transmitted to the signal lines SX, SZ via the transistors MN18, MN19, and thus data retained as potentials ADD' of the signal lines SX, SZ is read out.

Incidentally, the ferroelectric latch circuit shown in FIG. 8 is just an example and is not limited to this. Further, the circuit provided in the address buffer unit 71 for retaining the address information is not limited to the ferroelectric latch circuit, which may be any nonvolatile latch circuit.

Next, the operation in the ferroelectric memory according to the first embodiment will be described.

Figure 11:
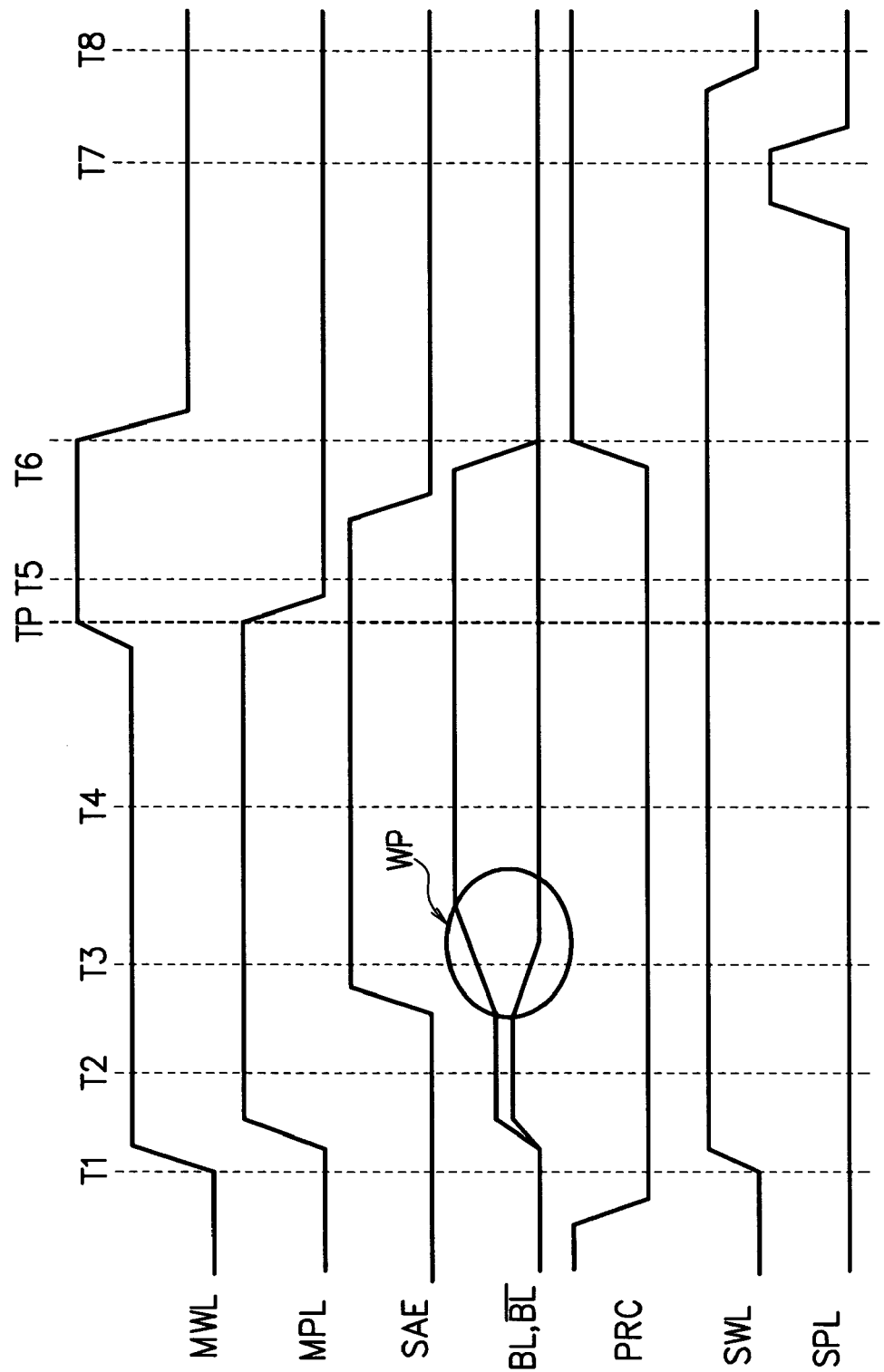
FIG. 11 is a timing chart showing a reading sequence of data in the ferroelectric memory according to the first embodiment.

FIG. 11 is a timing chart showing a reading sequence of data in the ferroelectric memory according to the first embodiment. FIG. 12A to FIG. 12H, and FIG. 13A to FIG. 13H are diagrams for describing polarization states of the ferroelectric capacitors of the memory cell and the guarantee cell during the reading sequence of data, respectively.

Incidentally, in FIG. 11, the word line MWL, the plate line MPL, the bit lines BL, /BL and so on are word line, plate line, bit lines and so on connected to a memory cell from which data is to be read. Further, in FIG. 12A to FIG. 12H, ○ denotes a polarization state of the ferroelectric capacitor retaining the data "0", and ● denotes a polarization state of the ferroelectric capacitor retaining the data "1". Similarly, in FIG. 13A to FIG. 13H, ○ and ● denote polarization states of the ferroelectric capacitors connected to the same bit lines as the ferroelectric capacitors retaining the data "0" and the data "1" respectively.

First, the guarantee flag is set before starting access to the memory cell in the memory device (ferroelectric memory). As setting of the guarantee flag, the bit lines to which the guarantee flag cell is connected are precharged to the power supply voltage VDD to write the data "1" in the guarantee flag cell.

Next, responding to activation of a not-shown chip select signal, the potential of the precharge signal line PRC becomes "H" to precharge the bit lines BL, /BL to the ground level. Thereafter, the potential of the precharge signal line PRC is deactivated to "L", which changes the bit lines BL, /BL to a floating state.

Figure 12A:
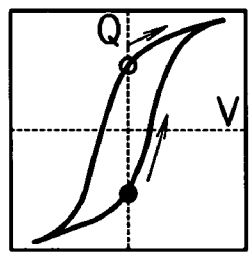
FIG. 12A to FIG. 12H are diagrams showing polarization states of ferroelectric capacitors of the memory cell during the reading sequence of data.
Figure 13A:
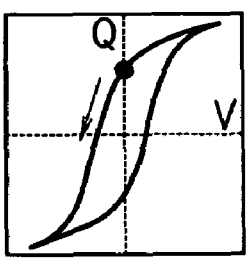
FIG. 13A to FIG. 13H are diagrams showing polarization states of ferroelectric capacitors of a guarantee cell during the reading sequence of data.

The polarization states of the ferroelectric capacitors of the memory cell and the guarantee cell in this initial state (state at time T1) are as shown in FIG. 12A, FIG. 13A. Specifically, in the initial state, the memory cell retains data, and the two ferroelectric capacitors in the memory cell are in different polarization states from each other which correspond to the data "1" and the data "0" respectively (refer to FIG. 12A). On the other hand, the guarantee cell is not needed to retain data in the initial state, which is just needed to operate so as to allow writing of data when the data is read out from the memory cell, so that the two ferroelectric capacitors in the guarantee cell are in the polarization state corresponding to the data "0" (refer to FIG. 13A).

Here, the reason why the initial state of the guarantee cell is a state of retaining the data "0" is to reduce time required for driving the plate line SPL so as to enable writing of data in the guarantee cell with the potential of the plate line SPL being "L". Specifically, the state of retaining the data "0" is set as the initial state of the guarantee cell so that the data "1" will be automatically written to the guarantee cell when the potentials of the bit lines transit to the power supply voltage.

Figure 12B:
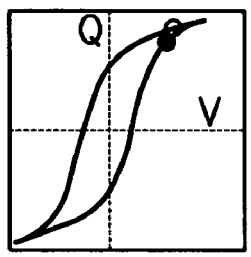
Figure 13B:
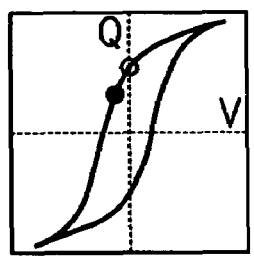

Next, potentials of the word lines MWL, SWL are turned to "H", and thereafter a potential of the plate line MPL is changed to "H". Incidentally, the potential of the plate line SPL is maintained to be "L". Thus, in the ferroelectric capacitors of the memory cell, a voltage is applied in a direction from the plate line MPL side to the bit lines BL, /BL side, so that the polarization states at time T2 change as shown in FIG. 12B. Therefore, electric charges having amounts according to the change of the polarization charge depending on retained data are supplied from the ferroelectric capacitors of the memory cell to the bit lines BL, /BL respectively (data is read out from the memory cell), and the potentials of the bit lines BL, /BL rise. The polarization states of the ferroelectric capacitors of the guarantee cell at this time T2 change due to the rise of the potentials on the bit lines BL, /BL as shown in FIG. 13B.

By change of the potential of the sense amplifier signal line SAE to "H" (by activation of the control signals PSA, NSA), a minute potential difference between the bit lines BL, /BL is amplified in the sense amplifier (a part WP shown in FIG. 11), which makes the potentials of the bit lines BLi, /BLi transit to "H" (the power supply voltage) and "L" (the ground level) respectively. The potentials of the bit lines BLi, /BLi are transmitted to the data signal lines DBi, /DBi respectively and outputted as read data.

Figure 12C:
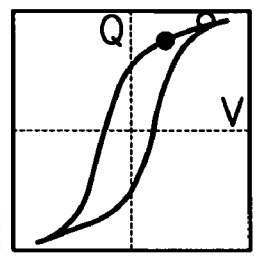
Figure 12D:
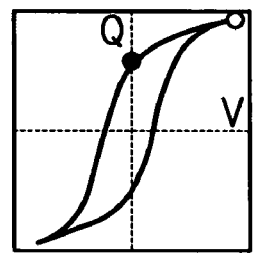

At this time, the polarization states of the ferroelectric capacitors of the memory cell are as shown in FIG. 12C (time T3) and FIG. 12D (time T4).

Figure 13C:
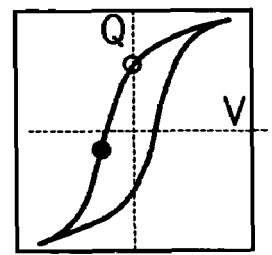
Figure 13D:
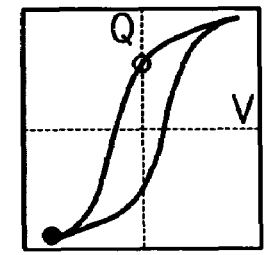

Further, to the ferroelectric capacitor of the guarantee cell connected to the bit line which transits to the power supply voltage, a voltage is applied in a direction from the bit lines BL, /BL side to the plate line SPL side. When the applied voltage becomes equal to or higher than a predetermined voltage, the polarization direction of the ferroelectric capacitor is inverted to change from the initial state of retaining the data "0" to a state of retaining the data "1". On the other hand, the ferroelectric capacitor of the guarantee cell connected to the bit line that transits to the ground level maintains the initial state since the applied voltage is very low (refer to FIG. 13C, FIG. 13D showing the polarization states at time T3, T4).

Specifically, the data retained by the two ferroelectric capacitors of the guarantee cell is the same as the data retained by the ferroelectric capacitors of the memory cell before reading out. Therefore, in the ferroelectric memory that is destructive reading, the data retained in the memory cell before reading out can be securely retained not in an unstable state by an electric charge but in a stable state.

Next, the restore operation of writing back the read data to the memory cell is performed.

Figure 12E:
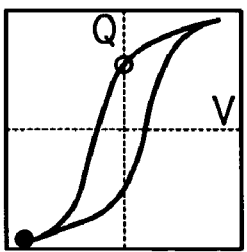
Figure 13E:
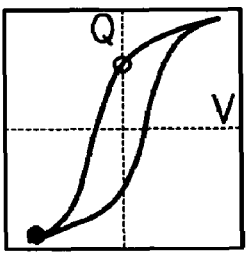

When the potentials of the bit lines BL, /BL are retained as the potentials at the time of outputting data, and the potential of the plate line MPL is changed to "L", the polarization directions of the ferroelectric capacitors of the memory cell retaining the data "1" before reading are inverted as shown in FIG. 12E (writing of the data "1"). Incidentally, the polarization states of the ferroelectric capacitors of the guarantee cell do not change as shown in FIG. 13E.

Figure 12F:
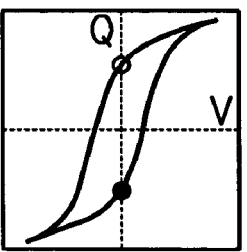

Thereafter, the potential of the sense amplifier signal line SAE is turned to "L" and the potential of the precharge signal line PRC is turned to "H", thereby precharging the bit lines BL, /BL to the ground level. Further, the word line MWL is changed to "L". The restore operation is completed as described above, and the memory cell returns to the same state as the state before reading out as shown in FIG. 12F.

Figure 13F:
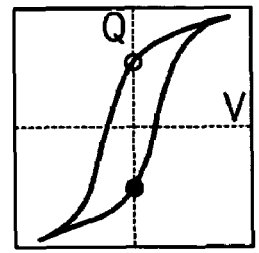

On the other hand, at time T6 after the restore operation is completed, the ferroelectric capacitors of the guarantee cell are in polarization states as shown in FIG. 13F. When the restore operation is completed, the data retained in the guarantee cell becomes unnecessary, and thus the guarantee cell has to be returned to the initial state to be capable of responding to operations such as next reading of data from the memory cell or the like. The state of the guarantee cell after the restore operation is completed is the same state as the memory cell before reading, and the initial state of the guarantee cell is almost the same as the state of the memory cell at the time that the data reading operation is completed. Therefore, the guarantee cell can be initialized by the same method as the reading of data from the memory cell.

Figure 13G:
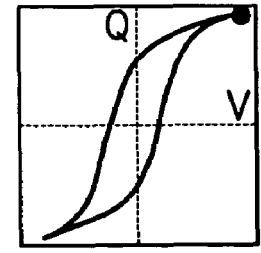
Figure 13H:
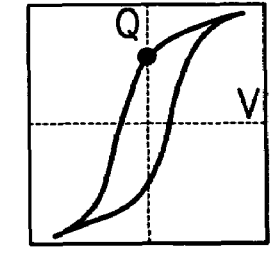

Specifically, in a state that the word line SWL is "H", the plate line SPL is turned to "H". At this time T7, the ferroelectric capacitors of the guarantee cell discharge an electric charge and change to the state of retaining the data "0" as shown in FIG. 13G, and thereafter the word line SWL and the plate line SPL are turned to "L". Thus, at time T8, the ferroelectric capacitors of the guarantee cell return to the initial state as shown in FIG. 13H. Further, as shown in FIG. 11, the guarantee cell performs initialization while the bit lines BL, /BL are precharged to the ground level, thereby suppressing increase of time required for processing.

Figure 12G:
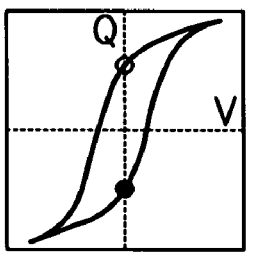
Figure 12H:
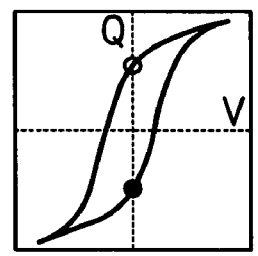

Incidentally, in the initialization of the guarantee cell, the bit lines BL, /BL are not in the floating state and are clamped to the ground level. At this time, no change of polarization state occurs in the memory cell as shown in FIG. 12G, FIG. 12H.

Further, the guarantee flag is initialized (changed to the data "0") after access (the read operation and the restore operation) to the memory cell is completed. Since the guarantee flag cell is connected to the same word line and plate line SPL as the guarantee cell, the guarantee flag is initialized automatically at the same time as the guarantee cell by the above-described initialization operation of the guarantee cell.

As described in detail above, according to the first embodiment, the guarantee cell 62 is provided on the bit lines BL, /BL to which the memory cells 61 are connected, and when the minute potentials on the bit lines BL, /BL generated by the data read out from the memory cell 61 are amplified by the sense amplifier 63, the read data is written at the same time to the guarantee cell 62 by the amplified potentials of the bit lines BL, /BL.

Consequently, the data retaining function in the ferroelectric memory is improved, the period in which the retaining state of data is unstable is reduced, and the destructively read data can be securely retained as nonvolatile binary data. Accordingly, even when a contingency occurs before the restore operation in which the data read out from the memory cell 61 is written back to the memory cell is completed, loss of the read data can be suppressed. Further, requirements for power supply can be alleviated, and capacitors for power supply provided in the conventional ferroelectric memory for preventing loss of data due to a power cut-off can be reduced, which suppresses increase in chip area and allows efficient use of chip or miniaturization of chip.

Hereinafter, a startup operation of the ferroelectric memory according to the first embodiment will be described. While in a state that the reading and writing sequences abnormally finish due to a power cut-off or the like and the data in the memory cell is destroyed, the ferroelectric memory according to the first embodiment writes data from the guarantee cell to the memory cell in the startup operation after the power is turned on. The writing process of data from the guarantee cell to the memory cell in the startup operation depends on a storing method of the address information, so that the following description will be divided into the case of storing the address information in the guarantee cell and the case of storing it in a nonvolatile latch circuit as shown in FIG. 7 and FIG. 8.

<The Case of Storing Address Information in the Guarantee Cell>

Figure 14:
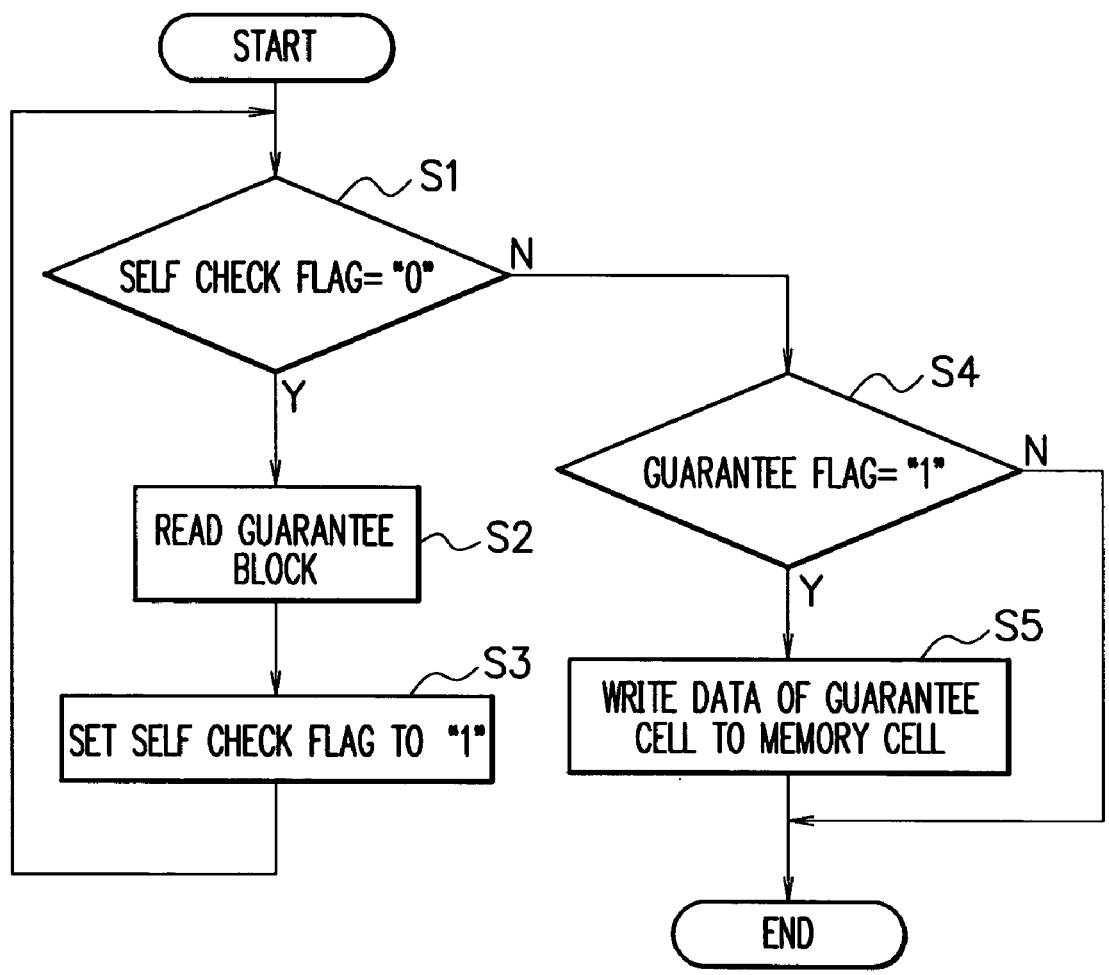
FIG. 14 is a flowchart showing an example of a startup operation in the ferroelectric memory according to the first embodiment.

FIG. 14 is a flowchart showing an example of the startup operation in the ferroelectric memory according to the first embodiment.

When the power is turned on in the memory device (ferroelectric memory), it is judged whether a self check flag is "0" or not in step S1. Here, an initial value of the self check flag after turning on the power is "0". Therefore, the operation mode of the memory device transits to a self check mode.

Incidentally, the memory device is configured not to accept any control from the outside when the memory device is operating in the self check mode. Further, in order to notify that the operation mode is the self check mode to an external controller or the like, the memory device may be configured to output a signal denoting that it is in the self check mode (for example, a signal using the self check flag) to the outside.

Next, reading of the guarantee block is performed in step S2. Specifically, the address of the guarantee cell (a local address in the memory device) is specified to be the same as that for reading data from the memory cell, and then the word line SWL and the plate line SPL are activated to allow reading of data from the guarantee cell in the active block. Here, the address of the guarantee cell is different from a normal address such as the address of the memory cell, which is for example an address in an address region to which access from the outside is prohibited, in order to prevent destruction of data by wrong access to the guarantee cell. Therefore, a decode logic for accessing the guarantee cell and a decode logic for accessing the memory cell are independent from each other, and thus the word lines MWL, SWL are independently controllable. With this configuration, usability thereof is improved, and an advantaged that double selection and activation of the word lines can be prevented is obtained.

The data read from the guarantee cell is amplified by the sense amplifier and maintained on the bit lines BL, /BL. Further, a guarantee flag and address information are read from the guarantee cell in the sleep block and amplified by the sense amplifier, and thereafter the address information is outputted to the internal address bus ADB to initialize the guarantee cell in the sleep block. Incidentally, judgment of whether it is in the active block or the sleep block is done according to the value of the guarantee flag.

In step S3, the value of the self check flag is set to "1", and the flow returns to step S1. According to the result of judgment in step S1, the flow goes to step S4, which judges whether the value of the guarantee flag is "1" or not, in other words, whether the restore operation is completed or not. If the value of the guarantee flag is "0" as a result of the judgment in step S4, the process is terminated and a normal operation is started.

On the other hand, if the value of the guarantee flag is "1" as a result of the judgment in step S4, the word line and plate line corresponding to the memory cell in which data is destroyed are selectively activated based on a decode result of the address information obtained in step S2. Thus, the data read out from the guarantee cell and retained in the bit lines BL, /BL is written to the memory cell to thereby complete the restoration of the destroyed data, and thus the normal operation is started.

FIG. 15 is a diagram showing a concrete configuration example of a bank in the ferroelectric memory in the case of storing the address information in the guarantee cell.

In FIG. 15, 55 denotes a plate line drive circuit, 56 denote column units for retaining data, and 57 denote column units for retaining a guarantee flag.

The column units 57 are each connected to bit lines BL1, /BL1 (BL2, /BL2) and have a plurality of memory cells 151 controlled by word lines MWLj and plate lines MPL1j (MPL2j), a guarantee cell 152 controlled by a word line SWL and a plate line SPL1 (SPL2), and a sense amplifier 153.

The bit lines BL1, /BL1 (BL2, /BL2) and guarantee flag signal lines FG1, /FG1 (FG2, /FG2) are connected via N-channel MOS transistors MN22, MN23 whose gates are connected to a column signal line CL1 (CL2). Further, the bit lines BL1, /BL1 (BL2, /BL2) are connected to the ground via N-channel MOS transistors MN24, MN25 whose gates are connected to precharge control signal lines SPR1 (SPR2), and to the bit line BL1 (BL2), a guarantee flag output line SF1 (SF2) is further connected.

Further, on the bit lines BL1, /BL1 (BL2, /BL2), N-channel MOS transistors MN26, MN27 whose gates are connected to an address control line ADCT1 (ADCT2) are provided.

The column units 56 are each configured similarly to the column unit 57. Bit lines BL, /BL included in the column units 56 are connected to an address bus ADB via transistors MN26, MN27 whose gates are connected to the address control line ADCT1 (ADCT2), and are connected to a data bus DTB via transistors MN22, MN23 whose gates are connected to the column signal line CL1 (CL2).

Figure 16:
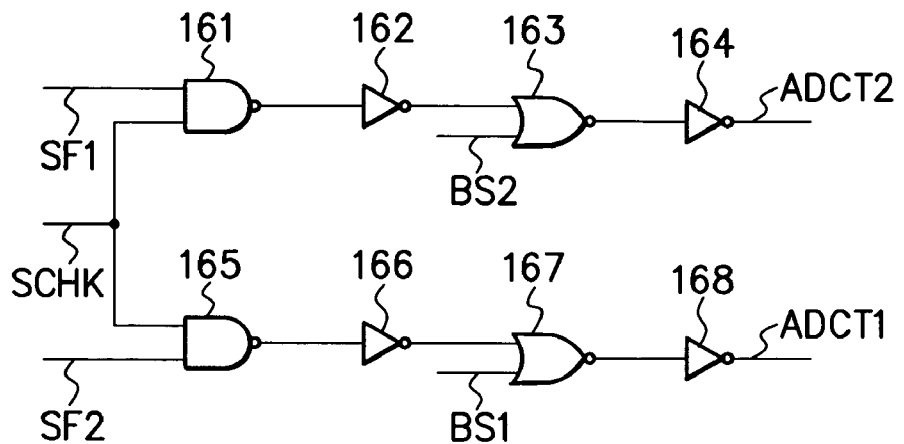
FIG. 16 and FIG. 17 are diagrams each showing an example of a circuit generating a signal to be supplied to the bank of the ferroelectric memory shown in FIG. 15.

FIG. 16 is a circuit diagram showing an example of a circuit generating potentials (address control signals) of the address control lines ADCT1, ADCT2 shown in FIG. 15.

In FIG. 16, SF1, SF2 are guarantee flag output lines, SCHK is a signal line outputting a potential related to the value of the self check flag, and BS1, BS2 are block selection signal lines. The signal line SCHK is "H" when the operation mode is the self check mode, and otherwise (normal operation) it is "L". Further, the block selection signal lines BS1, BS2 are "H" when the block is selected, in other words, when it is an active block, and otherwise it is "L".

The guarantee flag output line SF1 and the signal line SCHK are each connected to input terminals of a negative logical product operation circuit (NAND circuit) 161. An output terminal of the NAND circuit 161 is connected to one input terminal of a negative logical sum operation circuit (NOR circuit) 163 via an inverter 162. To the other input terminal of the NOR circuit 163, the block selection signal line BS2 is connected, and an output terminal thereof is connected to the address control line ADCT2 via an inverter 164.

The address control line ADCT1 is configured identically using the guarantee flag line SF2, the signal line SCHK, and the block selection signal line BS1 and by a NAND circuit 165, inverters 166, 168 and a NOR circuit 167, and therefore the description of which is omitted.

With the above configuration, only when the guarantee flag output line SF2 and the signal line SCHK are both "H" or when the block selection signal line BS1 is "H", the address control line ADCT1 becomes "H". Similarly, only when the guarantee flag output line SF1 and the signal line SCHK are both "H" or when the block selection signal line BS2 is "H", the address control signal line ADCT2 becomes "H".

Figure 17:
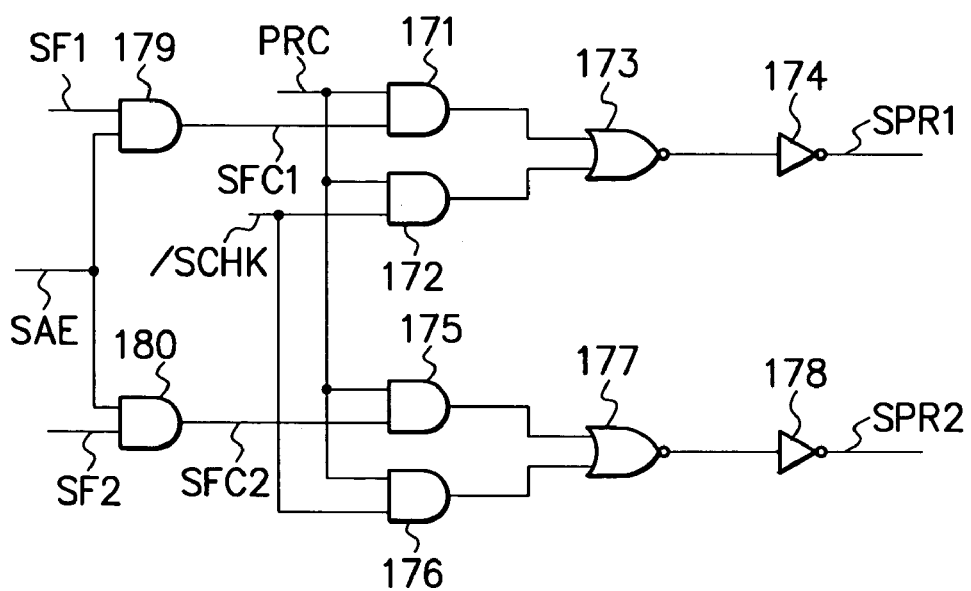

FIG. 17 is a circuit diagram showing an example of a circuit generating potentials of the precharge control signal lines SPR1, SPR2 shown in FIG. 15.

In FIG. 17, SF1, SF2 are guarantee flag output lines, /SCHK is a signal line outputting a potential related to a logically inverted value of the value of the self check flag, PRC is a precharge signal line, and SAE is a sense amplifier signal line. The signal line /SCHK is "L" when the operation mode is the self check mode, and otherwise (normal operation mode) it is "H".

To one input terminal of an AND circuit 179, the guarantee flag output line SF1 is connected, and to the other input terminal thereof, the sense amplifier signal line SAE is connected. To one input terminal of an AND circuit 171, the precharge signal line PRC is connected, and to the other input terminal thereof, an output terminal of the AND circuit 179 is connected via a signal line SFC 1. To one input terminal of an AND circuit 172, the precharge signal line PRC is connected, and to the other input terminal thereof, the signal line /SCHK is connected. To input terminals of a NOR circuit 173, output terminals of the AND circuits 171, 172 are connected, and an output terminal thereof is connected to the precharge control signal line SPR1 via an inverter 174. The precharge control signal line SPR2 is configured identically using the precharge signal line PRC, the guarantee flag output line SF2, the sense amplifier signal line SAE, and the signal line /SCHK, and by AND circuits 180, 175, 176, a NOR circuit 177, and an inverter 178, and therefore the description of which is omitted.

Figure 18:
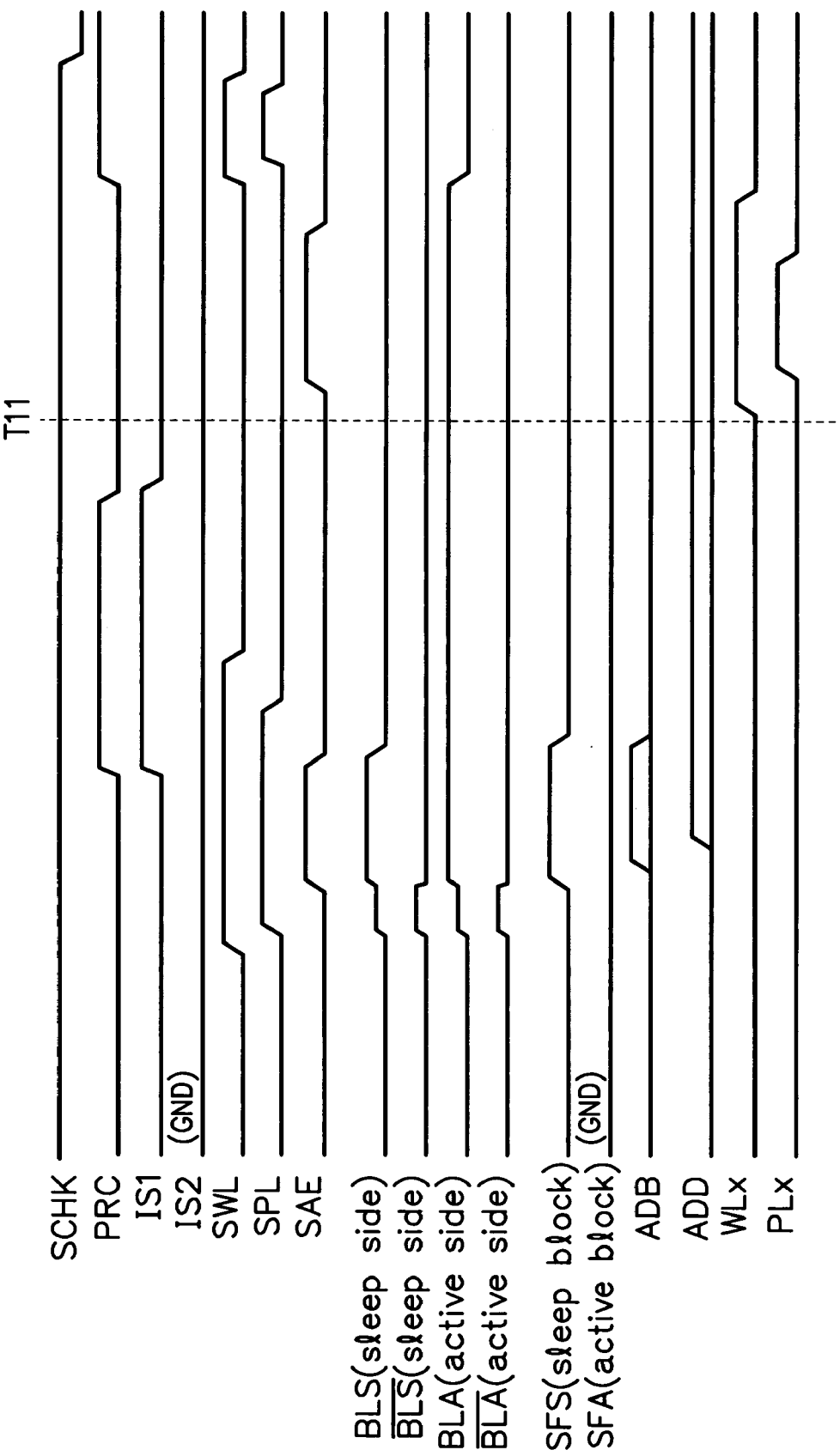
FIG. 18 is a timing chart showing a startup operation in the ferroelectric memory shown in FIG. 15.

FIG. 18 is a timing chart showing a startup operation in the ferroelectric memory shown in FIG. 15. Incidentally, in the following description, a block on the side having bit lines BLS, /BLS and a guarantee flag output line SFS is explained as a sleep block, and a block on the side having bit lines BLA, /BLA and a guarantee flag output line SFA is explained as an active block.

When the power of the memory device (ferroelectric memory) is turned on and the operation mode of the memory device transits to the self check mode, a potential of the signal line SCHK turns to "H".

By change of potentials of the word line SWL and the plate line SPL to "H", potentials of the bit lines BLS, /BLS, BLA, /BLA increase according to data retained in the guarantee cell. Further, by change of the potential of the sense amplifier signal line SAE to "H", a minute potential difference between the bit lines BLS, /BLS and a minute potential difference between the bit lines BLA, /BLA are amplified respectively. Accordingly, a guarantee flag and address information retained in the guarantee cell on the sleep block side are read out as digital data to the guarantee flag output line SF1 and the internal address bus ADB. The address information read to the address bus ADB is latched and retained as an address signal ADD for at least a period of the startup operation.

Subsequently, by change of the potential of the precharge signal line to "H", potentials of the bit line BLS and the guarantee flag output line SF1 become "L". The sense amplifier signal line SAE, plate signal line SPL, and word line SWL become "L" sequentially.

The potential of the precharge signal line becomes "L" again, and writing of data from the guarantee cell to the memory cell and initializing of the guarantee cell are performed after time T11. First, after a potential of a word line WLx is selectively turned to "H" based on the address signal ADD, the potential of the sense amplifier signal line SAE becomes "H". Further, a potential of a plate line PLx is selectively turned to "H", which turns to "L" after a predetermined period passes. Accordingly, the potentials of the bit lines BLA, /BLA according to data read out from the guarantee cell on the active block side are used to write the data "0" and the data "1" to the memory cell respectively, thereby restoring destroyed data.

Thereafter, the word line SWL and the plate line SPL become "H" sequentially to initialize the guarantee cell. The word line SWL and the plate line SPL become "L", and thus the operation mode transits from the self check mode to the normal operation mode (the potential of the signal line SCHK becomes "L").

<The Case of Storing Address Information in the Nonvolatile Latch Circuit>

FIG. 19 is a flowchart showing another example of the startup operation in the ferroelectric memory according to the first embodiment. Incidentally, in this FIG. 19, steps performing the same process as the steps shown in FIG. 14 are designated the same reference numerals, and steps performing not the same but corresponding process are designated the same reference numerals with "'".

The startup operation in the ferroelectric memory shown in FIG. 19 is the same as the startup operation in the ferroelectric memory shown in FIG. 14 except the process in step S2' and that reading of address information (step S11) is performed between step S4 and step S5.

Only step S2' and step S11 will be described below.

In step S2 shown in FIG. 14, the data, guarantee flag, and address information are read out from the guarantee cell, but in step S2', the address information is not stored in the guarantee cell, so that only the data and the guarantee flag are read out from the guarantee cell.

In step S11 to which the flow goes when the value of the guarantee flag is "1" as a result of judgment in step S4, the address information is read out from the nonvolatile latch circuit and supplied to each bank via the address bus, and the flow goes to step S5.

Figure 20:
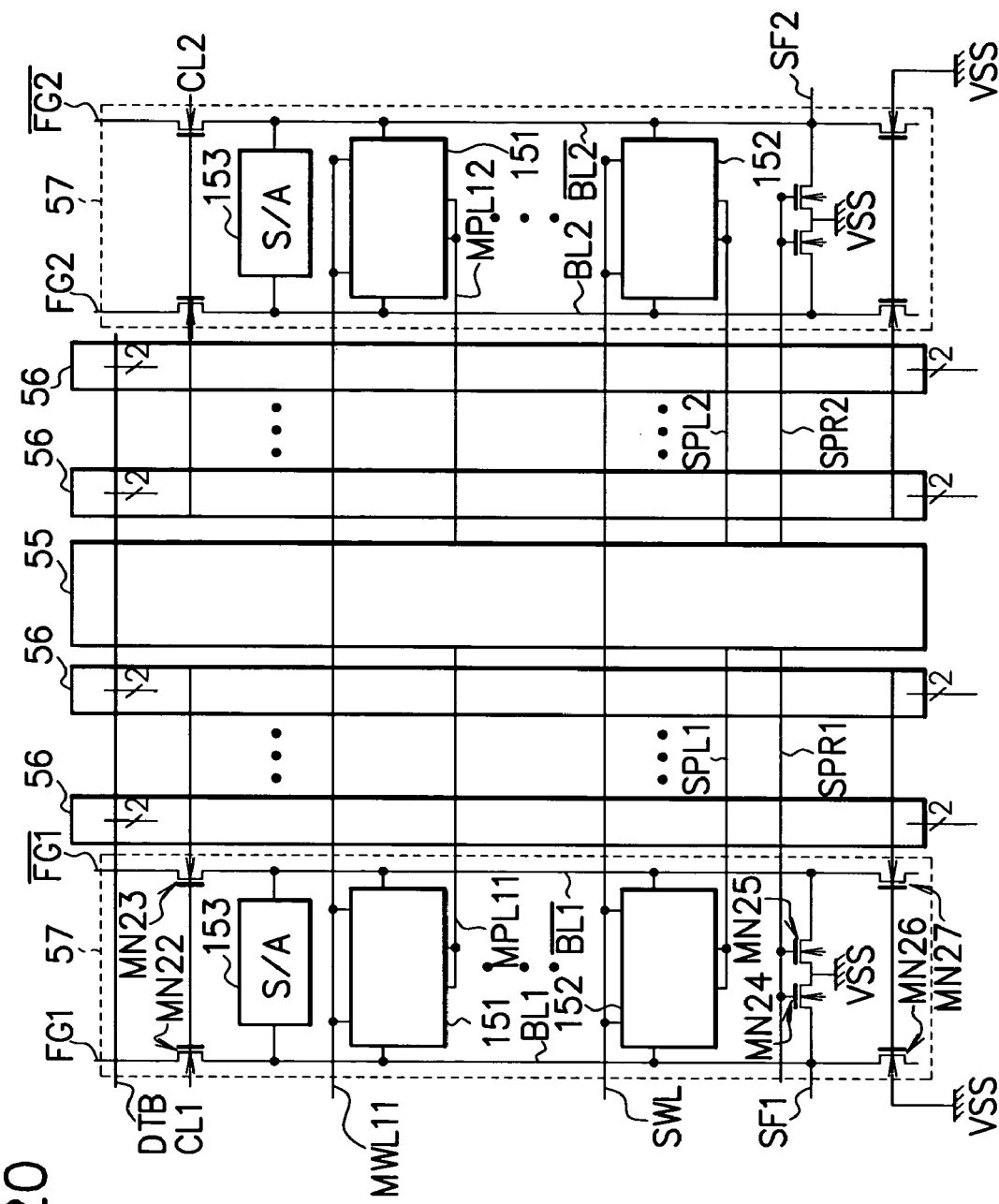
FIG. 20 is a diagram showing another concrete example of a bank of the ferroelectric memory according to the first embodiment.

FIG. 20 is a diagram showing a concrete configuration example of a bank in the ferroelectric memory in the case of storing address information in the nonvolatile latch circuit. Incidentally, in this FIG. 20, blocks and so on having the same functions as the blocks and so on shown in FIG. 15 are designated the same reference numerals, and duplicating descriptions are omitted.

In FIG. 20, a difference from the configuration of the bank in the ferroelectric memory shown in FIG. 15 is only that the gates of the N-channel MOS transistors MN26, MN27 are connected to the ground. When the address information is stored in the nonvolatile latch circuit, it is not necessary to output data read out from the guarantee cell to the internal address bus ADB, so that the transistors MN26, MN27 are constantly in an OFF state. Incidentally, the transistors MN26, MN27 may be omitted.

Further, a startup operation in the ferroelectric memory shown in FIG. 20 is different only in that the address information is read out from the nonvolatile latch circuit, and the rest of the operation is the same as in the timing chart shown in FIG. 18. An operational description of the entire startup operation in the ferroelectric memory shown in FIG.

20 is omitted, and only reading and writing of the address information in the nonvolatile latch circuit will be described.

Figure 21:
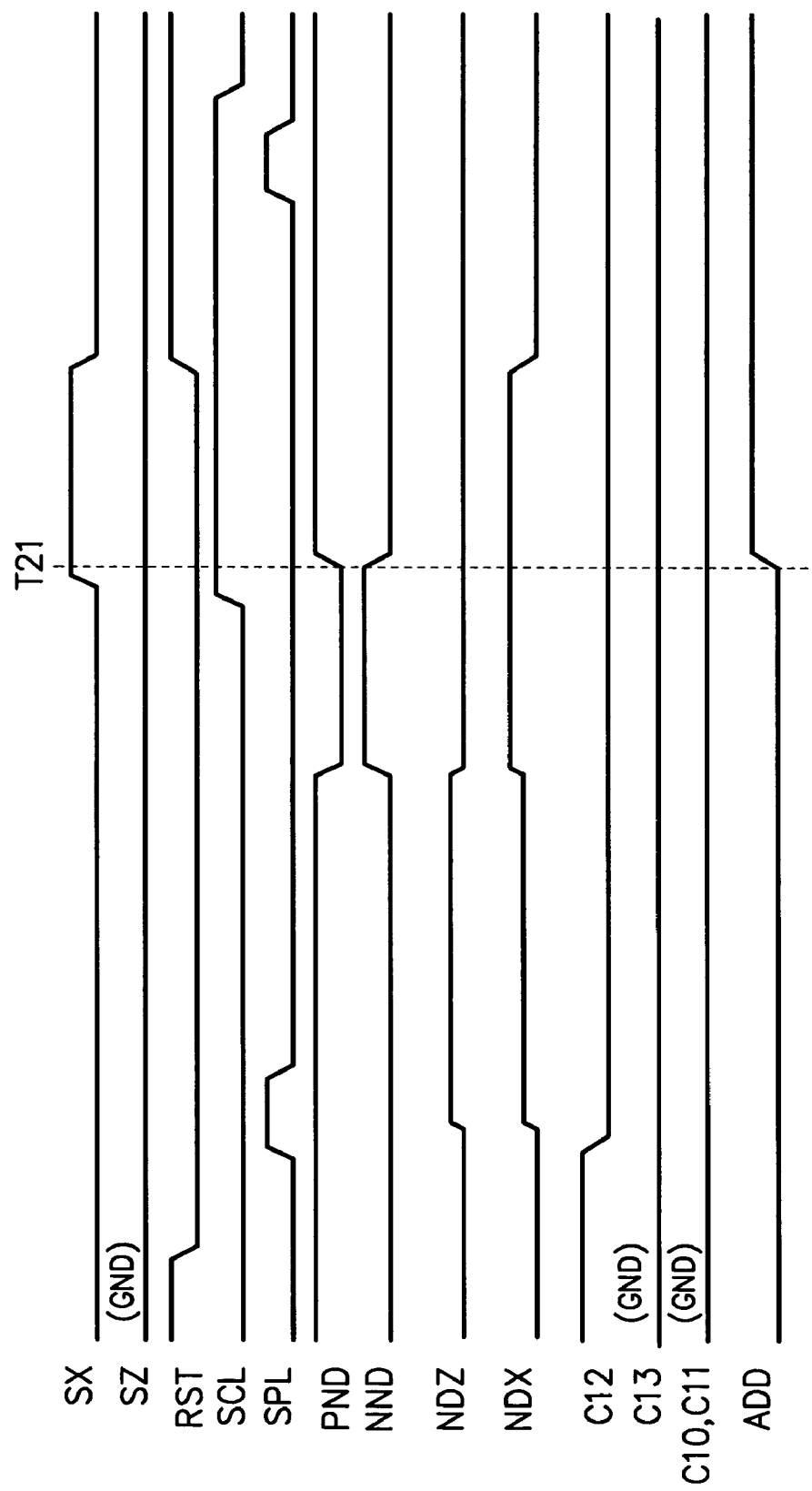
FIG. 21 is a timing chart showing a read operation of address information in the ferroelectric latch circuit shown in FIG. 8.

FIG. 21 is a timing chart showing a read operation of the address information in the nonvolatile ferroelectric latch circuit shown in FIG. 8. Incidentally, in FIG. 21, for the convenience of explanation, polarization directions of the ferroelectric capacitors C10 to C13 are shown corresponding to binary logic values. Further, at the beginning of the read operation, the ferroelectric capacitors C10, C11, C13 each have a polarization direction corresponding to the data "0", and the ferroelectric capacitor C12 has a polarization direction corresponding to the data "1".

When reading out the address information from the ferroelectric latch circuit, the potential of the signal line SPL is turned to "H" in a state that the power supply to the SRAM cell is cut off (state that the potentials of the signal lines PND, NND are "H", "L" respectively), which generates potentials corresponding to data retained in the ferroelectric capacitors C12, C13 on nodes NDX, NDZ of the SRAM cell. In the example shown in FIG. 21, the ferroelectric capacitors C12, C13 retain the data "1" and the data "0" respectively, so that the potential of the node NDX becomes higher than the potential of the node NDZ.

Thereafter, the potentials of the signal lines PND, NND are turned to "L", "H" respectively to supply power to the SRAM cell, and the nodes NDX, NDZ are amplified based on a potential difference by the SRAM cell, which then transit to the power supply voltage and the ground level respectively. When the potential of the signal line SCL is turned to "H", the potentials of the nodes NDX, NDZ are transmitted to the signal lines SX, SZ, and thus address information ADD of digital data is obtained at time T21.

Then, a reset signal RST is turned to "H", and the potentials of the signal lines SX, SZ are turned to the ground level, the signal line SPL is turned to "H", thereby initializing the ferroelectric capacitors C12, C13.

Figure 22:
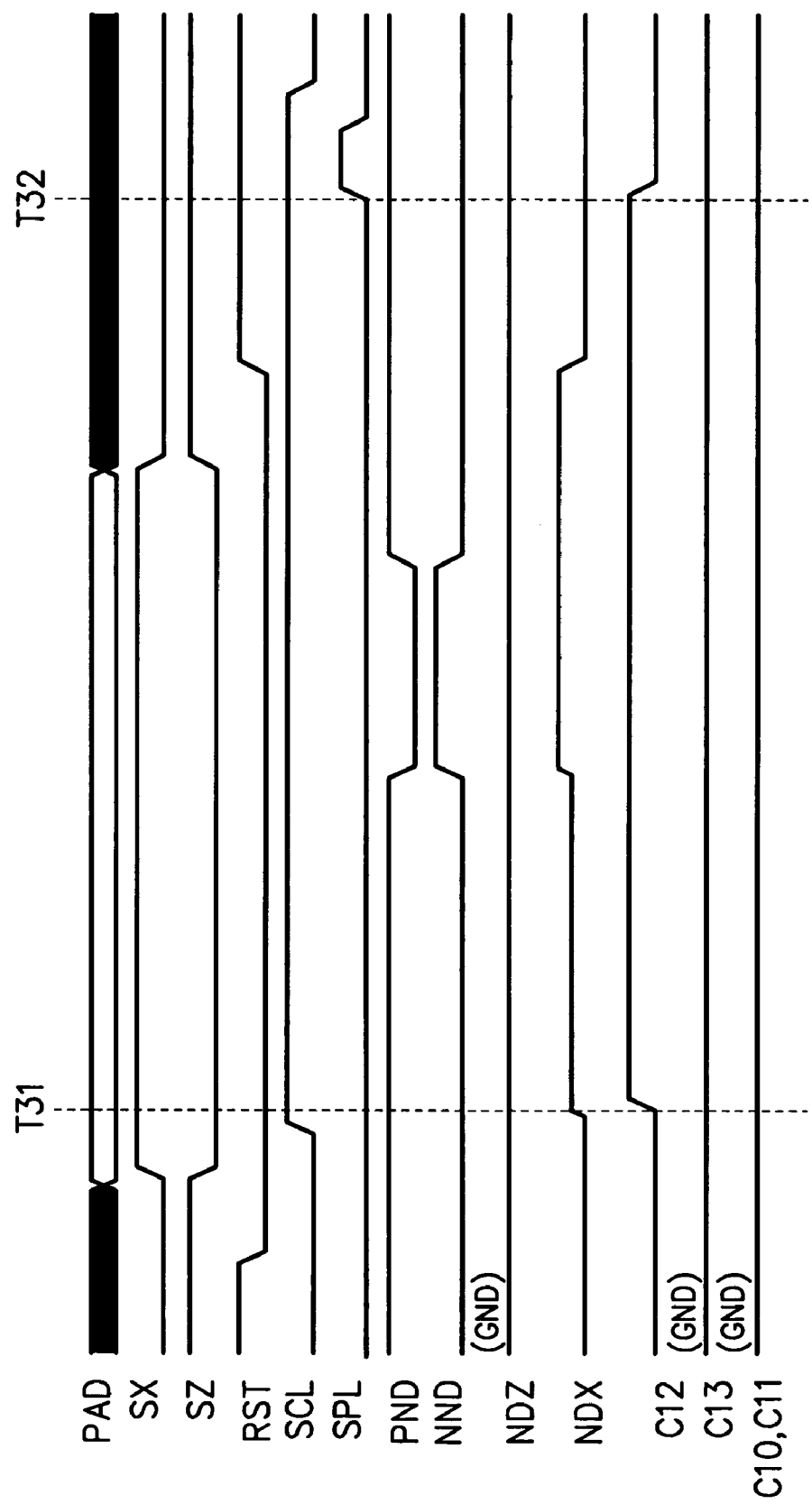
FIG. 22 is a timing chart showing a write operation of address information in the ferroelectric latch circuit shown in FIG. 8.

FIG. 22 is a timing chart showing a write operation of the address information during the normal operation in the nonvolatile ferroelectric latch circuit shown in FIG. 8. Incidentally, also in FIG. 22, the polarization directions of the ferroelectric capacitors C10 to C13 are shown corresponding to binary logic values similarly to FIG. 21.

When writing the address information to the ferroelectric latch circuit, a complementary signal is generated from an address PAD, which is inputted to the address buffer from the outside, and is supplied via the signal lines SX, SZ. Therefore, when the potential of the signal line SPL is maintained to be "L" and the potential of the signal line SCL is turned to "H" (time T31), the potentials of the signal lines SX, SZ are transmitted to the nodes NDX, NDZ respectively, and data corresponding to the potentials of the signal lines SX, SZ are written to the ferroelectric capacitors C12, C13.

Then, when initializing the ferroelectric capacitors C12, C13, the potential of the reset signal RST is turned to "H" in a state that the power supply to the SRAM cell is cut off, and the potentials of the signals SX, SZ (nodes NDX, NDZ) are turned to "L". By change of the potential of the signal line SPL to "H" (time T32), the data of the ferroelectric capacitors C12, C13 is destructively read and the ferroelectric capacitors C12, C13 are initialized.

As described above, in the ferroelectric memory according to the first embodiment, during the startup operation after the power is turned on, data in the guarantee block, especially in the guarantee flag cell, is read out, and it is judged whether the power is cut off or not in a state that the reading or writing sequence is completed. Then, if the guarantee flag is set (it is "1"), it is judged that the power is cut off in a state that the sequence is not completed (the restore operation is failed), and data retained in the guarantee cell is written to and restored in the memory cell based on retained address information.

Second Embodiment

Next, a second embodiment will be described.

The ferroelectric memory in the above-described first embodiment, the guarantee cell is added to the bit lines BLi, /BLi to which the memory cells 61 are connected as shown in FIG. 6, and the memory cells 61 and the guarantee cell 62 are always in a state of being connected electrically. Therefore, it is conceivable that increase in capacity due to addition of the guarantee cell 62 causes decrease in operation speed (sense speed) of the sense amplifier 63, or an electric charge discharged during initialization of the guarantee cell 62 charges the bit lines BLi, /BLi.

Accordingly, a ferroelectric memory to be described below that is application of a semiconductor memory device according to the second embodiment of the present invention allows electrical separation of memory cells and a guarantee cell by transfer gates (transistor) provided on bit lines, and enables control of an electrical connection state between the guarantee cell and the bit lines to which the memory cells are connected.

Configurations of the overall ferroelectric memory and a bank, which are application of the semiconductor memory device according to the second embodiment of the present invention, are the same as the ferroelectric memory in the first embodiment shown in FIG. 4 and FIG. 5, and thus the description thereof is omitted.

Figure 23:
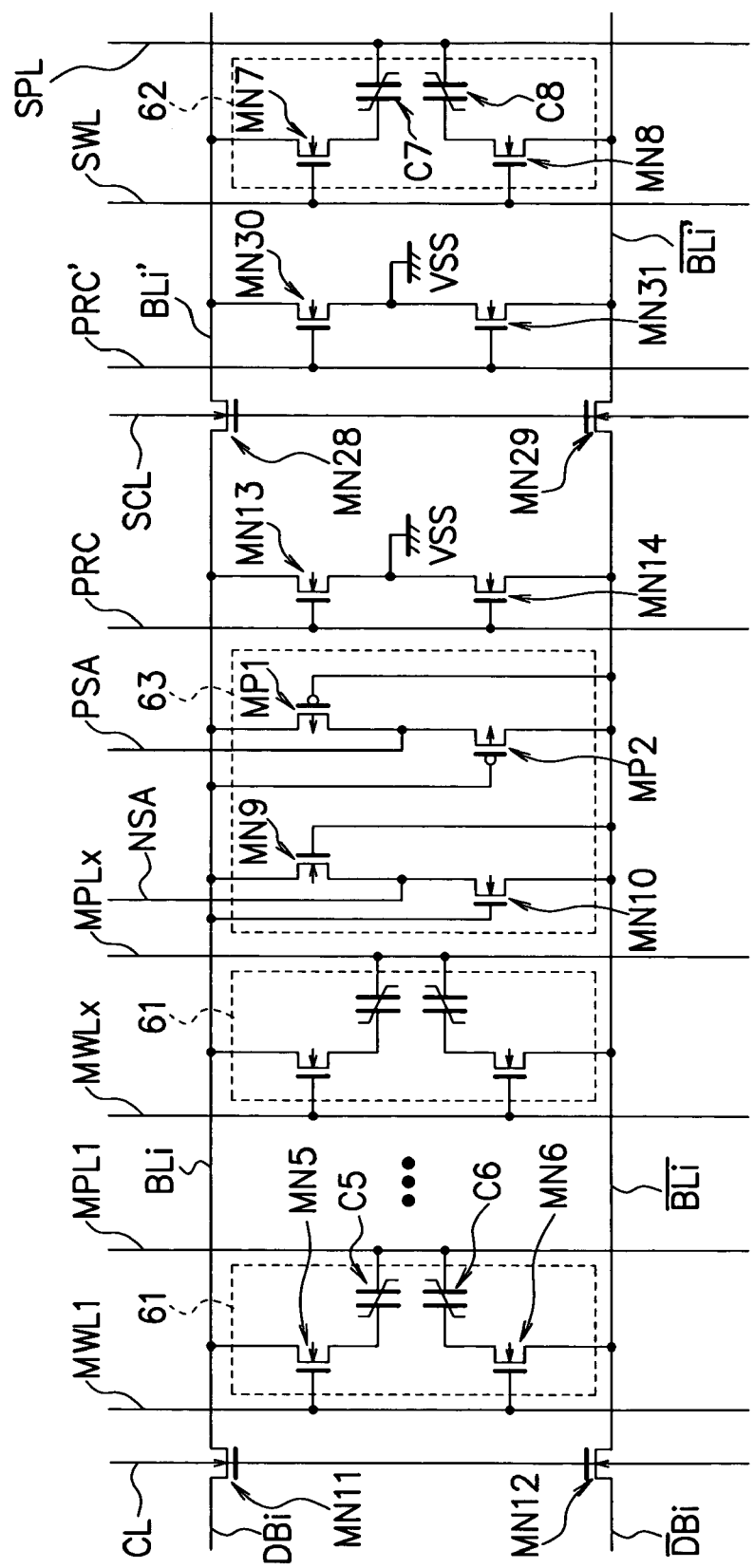
FIG. 23 is a circuit diagram showing an example of a column unit of a ferroelectric memory according to a second embodiment of the present invention.

FIG. 23 is a circuit diagram showing an example of a column unit of the ferroelectric memory in the second embodiment. Incidentally, in this FIG. 23, circuit components and so on having the same function as the circuit components shown in FIG. 6 are designated the same reference numerals, and duplicating descriptions are omitted.

There are two differences, which will be described below, between the column unit shown in FIG. 23 and the column unit shown in FIG. 6. First, in the column unit shown in FIG. 23, the bit lines BLi, /BLi to which the memory cells 61 are connected and bit lines BLi' and /BLi' to which the guarantee cell is connected are connected via N-channel MOS transistors (transfer gates) MN28, MN29 whose gates are connected to the control signal line SCL. Further, in the column unit shown in FIG. 23, there are provided N-channel MOS transistors MN30, MN31 whose gates are connected to a precharge signal line PRC' and capable of connecting the bit lines BLi', /BLi' to the ground level so that the bit lines BLi', /BLi' to which the guarantee cell is connected can be precharged to the ground level independently from the bit lines BLi, /BLi.

A data reading sequence of the ferroelectric memory in the second embodiment can be performed in substantially the same manner as in the ferroelectric memory in the above-described first embodiment.

Further, in the ferroelectric memory in the second embodiment, data read out from the memory cell can be retained in the guarantee cell until a sequence is completed, even in a so-called "read, modify, write" sequence in which data is read out from a memory cell and thereafter externally inputted data is written to this memory cell.

Specifically, when reading data from the memory cell, the potential of the control signal line SCL is turned to "H" so that the guarantee cell 62 is electrically connected to the bit lines BLi, /BLi. On the other hand, when writing data to the memory cell from the outside, the potential of the control signal line SCL is turned to "L" so as to cut off the electrical connection between the guarantee cell 62 and the bit liens BLi, /BLi before the potentials of the bit lines BLi, /BLi are changed by the writing data, in order to prevent destruction of data retained in the guarantee cell 62. Accordingly, the data before being written is retained in the guarantee cell 62, and when the read, modify, write sequence did not complete due to a contingency or the like, the data retained in the guarantee cell 62 can be written to the memory cell 61 similarly to the first embodiment. Therefore, loss of data can be prevented, and a state before the sequence is executed can be secured, and thus it becomes possible to execute the sequence again.

As described above, according to the second embodiment, the following effects are obtained in addition to the effects obtained in the first embodiment.

First, in the case where the guarantee cell 62 is not used, capacity of the guarantee cell 62 is cut off from the bit lines BLi, /BLi to which the memory cells 61 are connected to thereby avoid charging/discharging of unnecessary capacity, which improves the sense speed and also decreases the power consumption. Further, the number of access to the guarantee cell 62 can be decreased, and the deterioration of cell characteristics of the guarantee cell 62 can be prevented.

Further, by respectively providing the transistors for precharging the bit lines BLi, /BLi, and the bit lines BLi', /BLi' to the ground level, the bit lines BLi, /BLi and the bit lines BLi', /BLi' can be independently controlled even when timing of initialization or the like is different. Thus, swing or noise of the ground potential due to concentration of electric charges to the ground wiring can be suppressed, and recharging of the bit lines BLi, /BLi, which are once discharge and precharged to the ground level, due to the initialization of the guarantee cell 62 can be prevented, so that the increase in precharge time can be suppressed.

Moreover, the control signal line SCL may be connected to a pad portion in the ferroelectric memory or an external terminal owned by a chip, so as to allow control of whether or not to activate the data guarantee function by the guarantee cell 62. For example, when the control signal line SCL is connected to the pad portion, it can be connected to the power supply voltage or the ground level via a bonding wire or the like, thereby allowing the control of whether or not to activate the data guarantee function during production of chips. Further, for example, when the control signal line SCL is connected to the external terminal owned by a chip, whether or not to activate the data guarantee function can be easily controlled externally for every user, even when it is in a state that the power is supplied. Further, when the data guarantee function is not used, writing of data to the guarantee cell 62 is not performed, so that the startup operation after turning on the power can be configured not to perform the self check, thereby reducing the startup time after the power is turned on.

Incidentally, in the above description, the transfer gates MN28, MN29 whose gates are connected to the control signal line SCL are provided on the bit lines between the memory cells 61 and the guarantee cell 62, but the guarantee cell 62 and the bit lines BLi, /BLi may be connected via the transfer gates MN28, MN29 whose gates are connected to the control signal line SCL.

Third Embodiment

Next, a third embodiment will be described.

In the case where, for example, one guarantee cell is connected to a bit line to which memory cells are connected, it is conceivable that access concentrates to the guarantee cell to deteriorate cell characteristics in a very short period of time as compared to the memory cells. Accordingly, in a ferroelectric memory that is application of a semiconductor memory device according to the third embodiment of the present invention, a plurality of guarantee cells are connected to the bit line to which the memory cells are connected, thereby preventing concentration of access to one guarantee cell and suppressing the deterioration of cell characteristics of the guarantee cells.

The ferroelectric memory that is application of the semiconductor memory device according to the third embodiment of the present invention is configured similarly to the ferroelectric memory according to the above-described first and second embodiments.

FIG. 24 is a diagram showing characteristic elements of the ferroelectric memory according to the third embodiment, and showing address decoders 241, 242, a memory cell block 58, and a guarantee block 59 in a bank of the ferroelectric memory.

The memory cell block 58 is constituted of first to fourth memory cell blocks BLK1 to BLK4 which are partitioned according to addresses for selecting a row direction (word line MWL). Further, the guarantee block 59 is constituted of first to fourth guarantee blocks SC1 to SC4 which respectively correspond to the first to fourth blocks BLK1 to BLK4, and each of four guarantee cells connected to one bit line is arranged in each of the first to fourth guarantee blocks SC1 to SC4. Incidentally, although the memory cell block 58 and the guarantee block 59 are each constituted of four blocks in FIG. 24, the number of blocks is not limited to four, which may be any number.

The address decoder 241 decodes an address in the row direction which is supplied via an address bus ADB to thereby selectively activate one word line MWL (turn its potential to "H"). Similarly, the address decoder 242 decodes the address in the row direction which is supplied via the address bus ADB to thereby selectively activate one word line SWL.

In other words, in the ferroelectric memory configured as shown in FIG. 24, when the word line MWL of the first memory cell block BLK1 is selectively activated as a result of decoding the address in the row direction supplied via the address bus ADB by the address decoder 241, the word line SWL of the first guarantee block SC1 is selectively activated. Further, for example, when the word line MWL of the third memory cell block BLK3 is selectively activated, the word line SWL of the third guarantee block SC3 is selectively activated. Incidentally, the selection of the word line SWL to be activated is carried out based on the decode result of the address in the row direction by the address decoder 242.

As described above, according to the third embodiment, the plurality of guarantee cells are connected to the same bit line, and one guarantee cell is selectively accessed automatically from the plurality of guarantee cells according to the address in the row direction. Accordingly, access to the guarantee cell is dispersed so as to suppress the deterioration of cell characteristics of the guarantee cells.

It should be noted that, in the above-described first to third embodiments, the ferroelectric memory having the column units 56 constituted by the 2T/2C type memory cells is described as an example, but the present invention is applicable to a ferroelectric memory having column units constituted by the 1T/1C type memory cells.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

INDUSTRIAL APPLICABILITY

As described above, according to the present invention, to a bit line to which memory cells having ferroelectric capacitors are connected, a guarantee cell having ferroelectric capacitors is connected, and by a read operation of data from a memory cell, data is read out from the memory cell, and the data is written to the guarantee cell. Accordingly, the data read out from the memory cell is automatically written to the guarantee cell, and the data can be retained securely until a restore operation completes, which make it possible to suppress loss of data due to destructive reading, and the data can be retained in a stable state even when the operation of the semiconductor memory device becomes incomplete or stops due to a power cut-off or the like. Therefore, regardless of operating condition of the semiconductor memory device, data can be securely retained as nonvolatile binary data, and the loss of data can be suppressed.

Further, even when the power supplied to the semiconductor memory device is cut off during a reading or writing sequence of data from/to a memory cell and the data in the memory cell is destroyed, the data can be restored by writing data retained in the guarantee cell to the memory cell after the power is turned on, which can suppress mismatch of data before and after the power cut-off.

What is claimed is:

1. A semiconductor memory device, comprising:
   a plurality of word lines;
   a plurality of plate lines provided adjacent to said word lines respectively;
   a plurality of bit lines provided in an orthogonal direction to said word lines and said plate lines;
   a memory cell provided at each intersection of pairs of said word lines and said plate lines adjacent to said word lines and said bit lines, said memory cell having a ferroelectric capacitor; and
   a guarantee cell connected commonly with said memory cell to said bit lines, said guarantee cell having a ferroelectric capacitor,
   wherein during a read operation of data in connection with said memory cell, data is read out from said memory cell, and the data is written to said guarantee cell.

2. The semiconductor memory device according to claim 1,
   wherein data is written to said guarantee cell using potentials of said bit lines generated according to the data read from said memory cell.

3. The semiconductor memory device according to claim 1,
   wherein said guarantee cell has the same cell structure as said memory cell.

4. The semiconductor memory device according to claim 1,
   wherein said guarantee cell is constituted of the ferroelectric capacitor only.

5. The semiconductor memory device according to claim 1, further comprising:
   a guarantee flag cell storing a guarantee flag which indicates whether access processing to said memory cell is completed or not.

6. The semiconductor memory device according to claim 5,
   wherein said guarantee flag cell is connected to said plate line to which said guarantee cell is connected.

7. The semiconductor memory device according to claim 5,
   wherein when power is turned on, it is judged whether the access processing is in a completed state or not based on the guarantee flag, and when the access processing is not in a completed state, data retained in said guarantee cell is written to said memory cell.

8. The semiconductor memory device according to claim 1,
   wherein address information for accessing said memory cell is stored in a nonvolatile storage area.

9. The semiconductor memory device according to claim 8,
   wherein the address information is stored in a guarantee cell which is included in a block in an inactive state provided in the same bank as a block which is activated based on the address information.

10. The semiconductor memory device according to claim 8, further comprising:
    a ferroelectric latch circuit having a ferroelectric capacitor retaining the address information.

11. The semiconductor memory device according to claim 1, further comprising:
    a transfer gate controlling whether or not to electrically connect said bit line to which said memory cell is connected and said bit line to which said guarantee cell is connected.

12. The semiconductor memory device according to claim 11, further comprising:
    a first precharge circuit connected to said bit line to which said memory cell is connected and configured to turn said bit line to a ground potential; and
    a second precharge circuit connected to said bit line to which said guarantee cell is connected and configured to turn said bit line to the ground potential.

13. The semiconductor memory device according to claim 11,
    wherein whether to enable a data guarantee function or not is optionally selectable, and when the data guarantee function is not enabled, said transfer gate is closed.

14. The semiconductor memory device according to claim 13, further comprising:
    a pad portion to which a signal line is connected, the signal line being associated with a control signal for optionally switching whether to enable the data guarantee function or not.

15. The semiconductor memory device according to claim 13, further comprising:
    an external terminal to which a signal line is connected, the signal line being associated with a control signal for optionally switching whether to enable the data guarantee function or not.

16. The semiconductor memory device according to claim 1, further comprising:
    a transfer gate controlling whether or not to electrically connect said guarantee cell to said bit line to which said memory cell is connected.

17. The semiconductor memory device according to claim 1,
    wherein a plurality of said guarantee cells are connected to said bit lines, and wherein a guarantee cell to be used is selected from the plurality of said guarantee cells according to inputted address information.

18. The semiconductor memory device according to claim 1, wherein an initial state of said guarantee cell is a state of having a polarization direction which is retained during a reading operation of data.

19. The semiconductor memory device according to claim 1, wherein when reading or writing of data from/to said memory cell is performed, a potential of a plate line to which said guarantee cell is connected is a ground potential.

20. The semiconductor memory device according to claim 19, wherein said guarantee cell is initialized by setting a potential of said connected plate line to a power supply potential.

21. The semiconductor memory device according to claim 1, wherein during a precharge period to turn said bit lines to a ground potential, said guarantee cell is initialized.

22. The semiconductor memory device according to claim 1, wherein an address area of an address assigned to said memory cell and an address area of an address assigned to said guarantee cell are different.

23. The semiconductor memory device according to claim 1, wherein said guarantee cell is provided in an address area to which access from the outside is prohibited.

24. The semiconductor memory device according to claim 11, wherein when data is read out from said memory cell and thereafter data is written from the outside to said memory cell, said transfer gate is closed before the data from the outside is supplied to said bit line to which said memory cell is connected.

25. The semiconductor memory device according to claim 1, wherein during a self check operation after power is turned on, access from the outside to said memory cell is prohibited, and a notification signal notifying that the self check operation is in progress is outputted to the outside.

* * * * *